United States Patent [19]

Dreifus et al.

[11] Patent Number: 5,420,443
[45] Date of Patent: May 30, 1995

[54] MICROELECTRONIC STRUCTURE HAVING AN ARRAY OF DIAMOND STRUCTURES ON A NONDIAMOND SUBSTRATE AND ASSOCIATED FABRICATION METHODS

[75] Inventors: David L. Dreifus, Cary; Brian R. Stoner, Raleigh; Jeffrey T. Glass, Apex, all of N.C.

[73] Assignee: Kobe Development Corporation, Research Triangle Park, N.C.

[21] Appl. No.: 35,643

[22] Filed: Mar. 23, 1993

Related U.S. Application Data

[63] Continuation-in-part of Ser. No. 937,481, Aug. 28, 1992, which is a continuation-in-part of Ser. No. 811,425, Dec. 20, 1991, abandoned.

[51] Int. Cl.$^6$ .................. H01L 21/205; H01L 21/338
[52] U.S. Cl. ..................................... 257/77; 257/289; 257/390
[58] Field of Search .......................... 257/77, 390, 289; 156/DIG. 68, 603

[56] References Cited

U.S. PATENT DOCUMENTS

| | | | |
|---|---|---|---|
| 3,961,103 | 6/1976 | Aisenberg et al. | 427/39 |
| 4,607,591 | 8/1986 | Stitz | 118/666 |
| 4,691,662 | 9/1987 | Roppel et al. | 118/50.1 |
| 4,830,720 | 5/1989 | Singh et al. | 156/613 |
| 4,863,529 | 9/1989 | Imai et al. | 148/33.4 |
| 4,915,977 | 4/1990 | Okamoto et al. | 427/37 |
| 4,925,701 | 5/1990 | Jansen et al. | 427/38 |
| 4,971,832 | 11/1990 | Arai et al. | 427/39 |
| 5,006,914 | 4/1991 | Beetz, Jr. | 437/39 |
| 5,030,583 | 7/1991 | Beetz, Jr. | 437/39 |
| 5,036,373 | 7/1991 | Yamazaki | 357/17 |
| 5,221,411 | 6/1993 | Narayan | 156/603 |
| 5,236,545 | 8/1993 | Pryor | 156/613 |

OTHER PUBLICATIONS

Geis et al.; *Production of Large-Area Mosaic Diamond Films Approaching Single-Crystal Quality*, Paper Presented at the Electrochemical Society Meeting in Washington, D.C., May 6–10, 1991.

Inoue et al.; *Selected Area Deposition of Diamond Films*, J. Appl. Phys. 67 (12), Jun. 15, 1990.

Geis et al.; *Device Quality Diamond Substrates*, Diamond and Related Materials, I, pp. 684–687 (1992).

Jeng & Tuan; *Oriented Cubic Nucleations and Local Epitaxy During Diamond Grown on Silicon (100) Substrates*; American Institute of Physics; May 1990; pp. 1968–1970.

Yugo & Muto; *Generation of Diamond Nuclei by Electric Field in Plasma Chemical Vapor Deposition*; American Institute of Physics; Appl. Phys. Lett. 58 (10), Mar. 1991; pp. 1036–1038.

Ravi; *Microstructure and Morphology of Diamond—Current Issues*, Paper Presented at the Diamond Films Science & Technology Workshop at Stanford University, Feb. 1, 1991.

Primary Examiner—Jerome Jackson
Assistant Examiner—Donald L. Monin, Jr.
Attorney, Agent, or Firm—Bell, Seltzer, Park & Gibson

[57] ABSTRACT

A microelectronic structure including a plurality of spaced apart diamond structures on which a plurality of semiconductor devices may be formed. The semiconductor devices include a semiconducting diamond layer on each of the diamond structures. The diamond structures are preferably oriented relative to a single crystal nondiamond substrate so that the diamond structures have a (100)-oriented outer face for forming the semiconductor devices thereon. The microelectronic structure may be diced into discrete devices, or the devices interconnected, such as to form a higher powered device. One embodiment of the microelectronic structure includes the plurality of diamond structures, wherein each diamond structure is formed of a highly oriented textured diamond layer approaching single crystal quality, yet capable of fabrication on a single crystal nondiamond substrate. A method for fabricating the nondiamond highly oriented textured diamond layer includes carburizing a face of the nondiamond substrate, nucleating the carburized face by electrical bias enhanced nucleation, and selectively growing diamond favoring growth of the (100)-oriented grains.

52 Claims, 19 Drawing Sheets

MICROELECTRONIC STRUCTURE HAVING AN ARRAY OF DIAMOND STRUCTURES ON A NONDIAMOND SUBSTRATE AND ASSOCIATED FABRICATION METHODS

RELATED APPLICATION

This application is a continuation-in-part of application Ser. No. 07/937,481 filed Aug. 8, 1992 which is a continuation-in-part of application Ser. No. 07/811,425 filed Dec. 20, 1991, now abandoned.

FIELD OF THE INVENTION

The present invention relates to microelectronic structures and devices, and more particularly, to a microelectronic structure including diamond and respective semiconductor devices formed thereon.

BACKGROUND OF THE INVENTION

Diamond is a preferred material for semiconductor devices because it has semiconductor properties that are superior to conventional semiconductor materials, such as silicon, germanium or gallium arsenide. Diamond provides a higher energy bandgap, a higher breakdown voltage, and a higher saturation velocity than these traditional semiconductor materials.

These properties of diamond yield a substantial increase in projected cutoff frequency and maximum operating voltage compared to devices fabricated using more conventional semiconductor materials. For example, silicon is typically not used at temperatures higher than about 200° C. and gallium arsenide is not typically used above 300° C. These temperature limitations are caused, in part, because of the relatively small energy band gaps for silicon (1.12 Ev at ambient temperature) and gallium arsenide (1.42 Ev at ambient temperature). Diamond, in contrast, has a large band gap of 5.47 Ev at ambient temperature, and is thermally stable up to about 1400° C.

Diamond has the highest thermal conductivity of any solid at room temperature and exhibits good thermal conductivity over a wide temperature range. The high thermal conductivity of diamond may be advantageously used to remove waste heat from an integrated circuit, particularly as integration densities increase. In addition, diamond has a smaller neutron cross-section which reduces its degradation in radioactive environments, that is, diamond is a "radiation-hard" material.

Because of the advantages of diamond as a material for semiconductor devices, there is at present an interest in the growth and use of diamond for high temperature and radiation-hardened electronic devices. Diamond as a material for semiconductor devices may be either polycrystalline or single crystal. In particular, there is a present interest in the growth and use of single crystal diamond as a material for semiconductor devices. This interest is due in part to the increased efficiency of operation of single crystal semiconducting diamond in comparison with polycrystalline semiconducting diamond in which grain boundaries may impede the flow of charge carriers within the device.

Unfortunately, the fabrication of a single crystal diamond film is typically carried out by homoepitaxial deposition of a semiconducting diamond film on a single crystal diamond substrate. Such a single crystal diamond substrate is relatively expensive. In addition, large single crystal substrates may not be readily available for many desired applications.

A proposed microelectronic device having one or more semiconductor devices formed on a single crystal substrate, such as diamond, is described in U.S. Pat. No. 5,006,914 entitled *Single Crystal Semiconductor Substrate Articles and Semiconductor Devices Comprising Same* to Beetz. The patent discloses a microelectronic structure including a single crystal diamond substrate which is etched to form an array of spaced apart posts of single crystal diamond. On each post is grown a semiconducting layer of single crystal diamond to serve as an active channel region of a respective semiconductor device. Unfortunately, the use of a large single crystal diamond substrate as the starting point for the fabrication of the Beetz structure is relatively expensive.

Other attempts have been made to achieve some of the benefits of single crystal diamond while using less expensive and more readily fabricated polycrystalline diamond. For example, U.S. Pat. No. 5,036,373 to Yamazaki entitled *Electric Device With Grains and an Insulating Layer* discloses a light emitting device including a polycrystalline diamond structure wherein an insulating layer is provided between the diamond grain boundaries. The polycrystalline structure includes randomly positioned and unoriented grains. The insulating material prevents an overlying electrode from coming into electrical contact with graphite which is formed at the grain boundaries. Accordingly, a greater portion of the electrical energy may be converted into light rather than dissipated as heat energy.

Articles by Geis entitled *Production of Large-Area Mosaic Diamond Films Approaching Single-Crystal Quality* presented at the Electrochemical Society Meeting in Washington, D.C., May 6–10, 1991; and *Device Quality Diamond Substrates* appearing in Diamond and Related Materials, I, pp. 684–687 (1992), disclose a process for forming mosaic diamond films approaching single crystal quality. The films are formed by growing homoepitaxial diamond on an array of crystallographically oriented diamond seeds. The array of oriented diamond seeds are produced by passing a slurry of small (<100 μm diameter), faceted, diamond seeds over a substrate containing etch pits that match the diamond seed facets.

Unfortunately, the approach disclosed by Geis suffers from several shortcomings including a requirement that the diamond seeds must be mechanically positioned within each etch pit. Thus, voids will form where seeds are not positioned and good reproducibility of films is thereby degraded. The seed size must also be relatively large, and, accordingly, the minimum size of devices is typically at least 100 μm. The quality of the films may also be degraded by contamination on the diamond seeds since such seeds are typically formed in a high temperature and high pressure process using a metal catalyst, such as nickel. The Geis process is also labor intensive and requires a relatively long growth time of up to several days for coalescence of the diamond film.

Various other techniques for forming diamond films for semiconductor applications have been proposed. For example, U.S. Pat. No. 4,915,977 to Okamoto et al. proposes forming a diamond film by evaporating carbon onto the substrate by arc discharge at a carbon cathode and applying a negative bias voltage to the substrate so as to form a plasma glow discharge around the substrate. U.S. Pat. No. 4,830,702 to Singh et al. proposes a hollow cathode plasma assisted method and apparatus for forming diamond films. Unfortunately, such electrical discharge methods for forming diamond films often fail to produce high quality diamond films.

Microwave plasma enhanced CVD has also been used to form diamond films. In addition, techniques have been developed for enhancing the nucleation of diamond onto a silicon substrate, or other substrate, for the subsequent growth of a diamond film by a conventional growth process. For example, a diamond nucleation density on a substrate may be increased several orders of magnitude by simply scratching or abrading the substrate prior to placing it into the conventional CVD growth chamber. Although the size and density of grown diamond particles can be controlled to some extent by the size and density of the scratches, each diamond particle still grows in a random orientation.

Other attempts have been made to more effectively seed the nucleation process, such as by spraying the substrate with diamond powder through an air brush, or by ultrasonically abrading the substrate surface. U.S. Pat. No. 4,925,701 to Jansen et al. proposes seeding a substrate with a diamond powder to enhance nucleation. Unfortunately, each of these types of preparation techniques has to be performed outside of the plasma CVD reaction chamber. The scratching and seeding techniques, also fail to produce a surface which is sufficiently smooth to permit in-situ monitoring of the diamond growth rate. Therefore, ex-situ analysis is commonly used, such as cross-sectional scanning electron microscopy or profilometry. Such ex-situ analysis does not permit processing parameters to be controlled during the diamond growth process.

An article entitled *Generation of Diamond Nuclei by Electric Field in Plasma Chemical Vapor Deposition*, by Yugo et al. appearing in Applied Physics Letters, 58 (10) pp. 1036–1038, Mar. 11, 1991, proposes a predeposition of diamond nuclei on a silicon mirror surface prior to a conventional diamond CVD growth process. A high methane fraction (i.e., at least 5 percent) in the feed gas is taught by Yugo along with a electrical bias of 70 volts negative with respect to ground applied to the substrate for a time period of just several minutes.

The Yugo article also proposes that a balance must be struck between the biasing voltage and the methane content of the gas mixture. The authors of the Yugo article theorize that an excessive acceleration of the ions from a high voltage can destroy newly formed diamond nuclei. Yugo suggests that revaporization of the newly formed diamond nuclei should be suppressed by mitigating the ion impact by keeping the magnitude of the bias voltage low. Thus, in order to offset the low bias voltage, the degree of carbon over saturation, as determined by the methane percentage, should be increased. Yugo reported that diamond nuclei growth did not occur below 5% methane content and that high densities of nuclei occurred only above 10% methane. In addition, the absolute value of the biasing voltages were maintained below 200 volts negative with respect to ground to avoid revaporization from high energy impacting ions. The total time duration for the pretreatment was limited to between 2 to 15 minutes.

The growth of heteroepitaxial, or textured diamond films comprising a plurality of locally heteroepitaxial diamond areas, therefore, is an important goal if the economical fabrication of diamond electronic devices, for example, is to become a reality. Heteroepitaxial or textured growth has been reported on cubic-boron nitride (c-BN), nickel and silicon. C-BN has shown promise as a heteroepitaxial substrate for diamond due to its close lattice match and high surface energy. However, it is presently difficult to grow c-BN in large single crystal form. Recent results report that local epitaxial growth of diamond on nickel is attractive. Nickel has a close lattice match with diamond although its catalytic properties on the decomposition of hydrocarbons into $sp^2$ bonded structures may make it difficult to inhibit the formation of graphite during diamond growth and nucleation. Furthermore, it is difficult to obtain diamond films which adhere well to nickel.

An article by Jeng et al. in Applied Physics Letters, 56 (20) p. 1968, (1990), reported limited texturing of diamond on silicon substrates having a semicrystalline silicon carbide surface conversion film thereon. The lattice match between $\beta$-SiC (a=4.36 Å) and diamond (a=3.57 Å) is not extremely attractive; however, $\beta$-SiC grows epitaxially on Si despite a 24% lattice mismatch.

For many microelectronic applications there is a need for an array of interconnected semiconductor devices to provide higher power handling capability, for example. There is also a need to fabricate discrete devices economically, such as may be achieved by dicing a substrate containing an array of semiconductor devices, such as FET's. Moreover, there still exists a need to form high quality diamond films, such as textured diamond films approaching single crystal quality, to take advantage of the many attractive properties of diamond for semiconductor devices.

SUMMARY OF THE INVENTION

In view of the foregoing background, it is therefore an object of the invention to provide a microelectronic structure and associated method for making the structure including a plurality of diamond semiconductor devices, each having relatively high performance characteristics approaching those of single crystal diamond without requiring the use of a single crystal diamond substrate.

This and other objects, features, and advantages of the present invention are provided by a microelectronic structure including a plurality of laterally spaced apart diamond structures on a single crystal nondiamond substrate, wherein the outermost faces of the diamond structures are substantially oriented relative to the single crystal nondiamond substrate. A respective semiconductor device is then preferably formed on each of the diamond structures. The semiconductor devices may be interconnected to form a high powered device or a logic gate, for example, or the substrate may be diced to yield a plurality of discrete devices.

As would be readily understood by those skilled in the art, the semiconductor devices may include diodes, field effect transistors (FET's), radiation detectors, photoconductive switches, thermistors and other types of sensors. Accordingly, the semiconductor devices preferably include a layer of high quality semiconducting diamond equaling or approaching the quality of single crystal diamond, without requiring a large single crystal diamond substrate for fabrication.

Each of the plurality of diamond structures may be arranged in an array having predetermined lateral spacings between adjacent diamond structures. In addition, each of the diamond structures has outermost face dimensions not less than about 20 microns on a side and, more preferably, not less than about 100 microns on a side. A filler material may also be provided between adjacent ones of the diamond structures.

In one embodiment of the invention, each of the plurality of diamond structures is a highly oriented textured diamond layer including a plurality of side-by-side columnar single crystal diamond grains extending outwardly from the nondiamond substrate. Substantially all of the columnar single crystal diamond grains in each of the diamond structures are preferably oriented with a tilt and azimuthal misorientation of less than about 8°, and more preferably, less that about 5° relative to the single crystal nondiamond substrate. The diamond nucleation site density, or concentration is also relatively high, that is, greater than about $10^4/cm^2$ and, more preferably, greater than about $10^5/cm^2$.

The method for making the highly oriented textured diamond layer according to the present invention includes carburizing the substrate surface, nucleating the carburized substrate, and growing diamond onto the nucleated substrate to favor growth of the (100)-oriented face. The method is described in U.S. patent application Ser. No. 07/937,481, the disclosure of which is incorporated herein by reference. Thus, the innermost face of the plurality of diamond structures adjacent the nondiamond substrate is planar and devoid of protrusions. In addition, a carbide interfacial layer is preferably formed between each of the diamond structures and the nondiamond substrate.

To facilitate formation of the semiconductor devices on the plurality diamond structures, each of the columnar single crystal diamond grains in respective diamond structures preferably have outermost faces substantially flush with adjacent ones of the diamond grains. Accordingly, the outermost face at each of the diamond structures is relatively flat. In addition, a semiconducting diamond layer is preferably formed on the outermost faces of the plurality of columnar single crystal diamond grains. Moreover, this semiconducting diamond layer is of considerably higher quality than a polycrystalline diamond film.

For example, the semiconducting diamond film formed on the highly oriented textured diamond layer according to the present invention may have a hole mobility of greater than about 100 $cm^2/V$-s and, more preferably, greater than about 300 $cm^2/V$-s based upon an atomic boron concentration of about $10^{18}$ at room temperature. In other words, the semiconductor diamond layer preferably has a hole mobility at room temperature corresponding to a value greater than about 100 $cm^2/V$-s, and more preferably, greater than about 300 $cm^2/V$-s, for a dopant concentration of about $10^{18}$ $cm^{-3}$. As would be readily understood by those skilled in the art, other dopant concentrations would produce somewhat different hole mobilities. For example, lower dopant levels are expected to produce higher hole mobilities and vice versa. The relatively high hole mobilities of the present invention compare to polycrystalline diamond film mobilities of only about 2–40 $cm^2/V$-s, and single crystal diamond mobilities of about 300–400 $cm^2/V$-s.

In a second embodiment of the microelectronic structure according to the invention, the plurality of laterally spaced apart diamond structures include single crystal diamond grains. More particularly, one or more successive diamond layers are formed on the single crystal nondiamond substrate. Each of the diamond layers includes single crystal diamond grains substantially oriented to corresponding diamond grains in adjacent layers. The single crystal diamond grains of successive diamond layers preferably have progressively increasing outer face dimensions in successive layers extending outwardly from the nondiamond substrate.

Another aspect of the present invention is that the highly oriented textured diamond material may also be used for other microelectronic applications, such as a starting layer or substrate material for forming high quality diamond devices. The highly oriented textured diamond layer includes opposing first and second major faces and includes a plurality of side-by-side columnar single crystal diamond grains extending between the first and second opposing major faces. Substantially all of the columnar single crystal diamond grains having respective outer faces at the second major face of the diamond layer are preferably oriented relative to one another, that is, they are preferably oriented with a tilt and azimuthal misorientation of less than about 8°, and more preferably, less that about 5°.

The highly oriented textured diamond layer has its first major face being substantially planar and devoid of any protrusions. The columnar single crystal diamond grains at the second major face of the highly oriented textured diamond layer are substantially flush with adjacent faces to form an overall relatively flat second major face for the highly oriented textured diamond layer. As described above, a semiconducting diamond layer on the second face of said highly oriented textured diamond layer will be of a quality approaching considerably more expensive single crystal diamond. For example, the hole mobility of the semiconducting diamond layer may be greater than about 100 $cm^2/V$-s and, more preferably, greater than about 300 $cm^2/V$-s based upon an atomic boron concentration of about $10^{18}$ at room temperature.

A method according to the present invention includes making a plurality of semiconductor diamond devices on a single crystal nondiamond substrate. More particularly, the method includes the steps of forming a plurality of laterally spaced apart diamond structures on the single crystal nondiamond substrate so that each of the diamond structures has an outermost face being substantially oriented relative to the single crystal nondiamond substrate, and forming a respective semiconductor device on each of the plurality of diamond structures. The step of forming each of the semiconductor devices preferably includes forming a source electrode, a drain electrode, a gate electrode and gate insulating layer on the semiconducting diamond layer, thereby defining a field effect transistor.

The substrate may be diced to separate the plurality of semiconductor devices into discrete devices. Dicing may be readily achieved using conventional cutting tools, since the material between the diamond structures is a nondiamond material.

One embodiment of the method includes forming a plurality of laterally spaced apart highly oriented textured diamond layers, each including a plurality of side-by-side columnar single crystal diamond grains extending outwardly from the nondiamond substrate. Substantially all of the columnar single crystal diamond grains are preferably formed to be oriented within a tilt and azimuthal misorientation of less than about 8°, and more preferably, less that about 5° relative to the substrate. The step of forming the plurality of columnar single crystal diamond grains includes carburizing a face of the substrate, nucleating the carburized substrate face with diamond, and depositing diamond onto the nucleated substrate face. The nucleation site concentration of the substrate may be greater than about $10^4/cm^2$, and more preferably, greater than about $10^5/cm^2$.

The step of nucleating the carburized substrate face includes exposing the substrate face to a carbon-containing plasma while electrically biasing a diamond layer adjacent the substrate face and also exposed to the plasma. The electrically biasing is preferably carried out at a peak absolute value of not less than about 250 volts negative with respect to ground. The electrical bias supplied may be pure DC, pulsed DC, alternating current (AC 50 or 60 Hz), or radio frequency (RF).

Without wishing to be bound thereto, applicants theorize that the diamond layer contributes to the enhancement of diamond nucleation by either of two mechanisms. First, it is theorized that the diamond is chemically transported from the diamond film to the substrate. In other words, it is possible that the diamond is being moved from the diamond film adjacent the substrate face via an etching and deposition process. A second theory is that increased gas phase dissociation is caused by electron emission from the diamond film and that a higher concentration of dissociated hydrocarbons are being created by this electron dissociation process.

The step of exposing both the nondiamond substrate and the adjacent diamond layer to the carbon-containing plasma preferably includes exposing both to the carbon-containing plasma having an atomic percentage of carbon of not more than about 0.3 atomic percent, such as provided by a methane gas plasma mixture having a percentage of methane of not more than about 5 percent by weight.

The face of the substrate may also preferably be optically monitored and the electrical biasing discontinued responsive to a change in the substrate indicative of the start of growth of a diamond film on the substrate. For example, laser reflection interferometry or optical pyrometry may be used to monitor the face of the substrate. Then, diamond is preferably deposited onto the substrate while controlling processing conditions to favor growth of diamond having a (100)-oriented outer face.

A variation of the method for forming a plurality of laterally spaced apart diamond structures includes the steps of forming a highly oriented textured diamond layer including the plurality of side-by-side columnar single crystal diamond grains extending outwardly from the nondiamond substrate and covering the substrate face, and etching the highly oriented textured diamond layer to produce the plurality of laterally spaced apart diamond structures. In other words, the highly oriented textured diamond layer may be formed covering the substrate. The diamond layer may then be patterned and etched to yield an array of laterally spaced apart diamond structures, such as for permitting dicing into discrete devices.

An alternate method according to the invention includes forming a plurality of single crystal diamond grains as the laterally spaced apart diamond structures. A plurality of successive diamond layers are formed on the substrate, wherein single crystal diamond grains of each layer are preferably substantially oriented with respective single crystal diamond grains of an adjacent layer. In addition, selective masking is used to produce successive diamond layers, wherein the single crystal diamond grains have progressively increasing outer face dimensions in successive layers extending outwardly from the nondiamond substrate.

Another method for forming the plurality of laterally spaced apart diamond structures includes positioning a plurality of single crystal diamond seeds on the nondiamond substrate, and forming successive diamond layers on the seeded substrate. The single crystal substrate may first be etched using conventional techniques to form aligned etch pits into which diamond seeds are placed. Diamond is then deposited onto the seeds as disclosed in a publication entitled *Production of Large-Area Mosaic Diamond Films Approaching Single-Crystal Quality* by Geis et al., paper presented at the Electrochemical Society Meeting in Washington, D.C., May 6-10, 1991, the disclosure of which is incorporated herein by reference. See also, the article by Geis entitled *Device Quality Diamond Substrates* appearing in Diamond and Related Materials, I, pp. 684-687 (1992), the disclosure of which is also incorporated herein by reference. Alternately, the plurality of diamond structures may be formed by selective area deposition by forming an array of unmasked areas onto which diamond is then deposited. As would be readily understood by those skilled in the art, the diamond may be deposited by plasma assisted CVD, molecular beam epitaxy, hot filament assisted growth, or flame torch methods.

BRIEF DESCRIPTION OF THE DRAWINGS

FIG. 2 is a greatly enlarged schematic cross-sectional view of one of a plurality of diamond structures according to the invention and as shown in FIG. 1a.

DESCRIPTION OF THE PREFERRED EMBODIMENTS

Figure 1A:
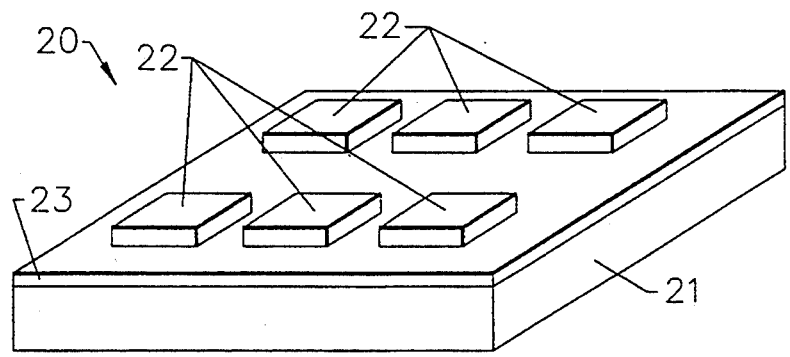
FIG. 1a is a perspective schematic view of an embodiment of a microelectronic structure according to the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of the layers and regions are exaggerated for clarity. Like numbers refer to like elements throughout, and prime and double prime notation are used to indicated like elements in alternate embodiments.

Figure 2:
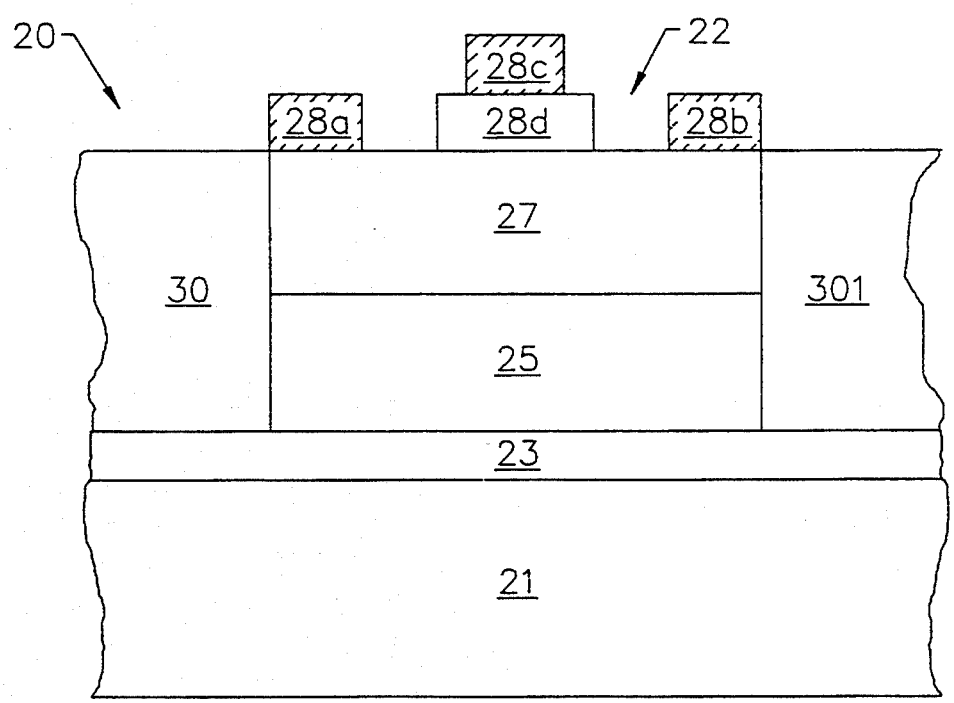
Figure 1B:
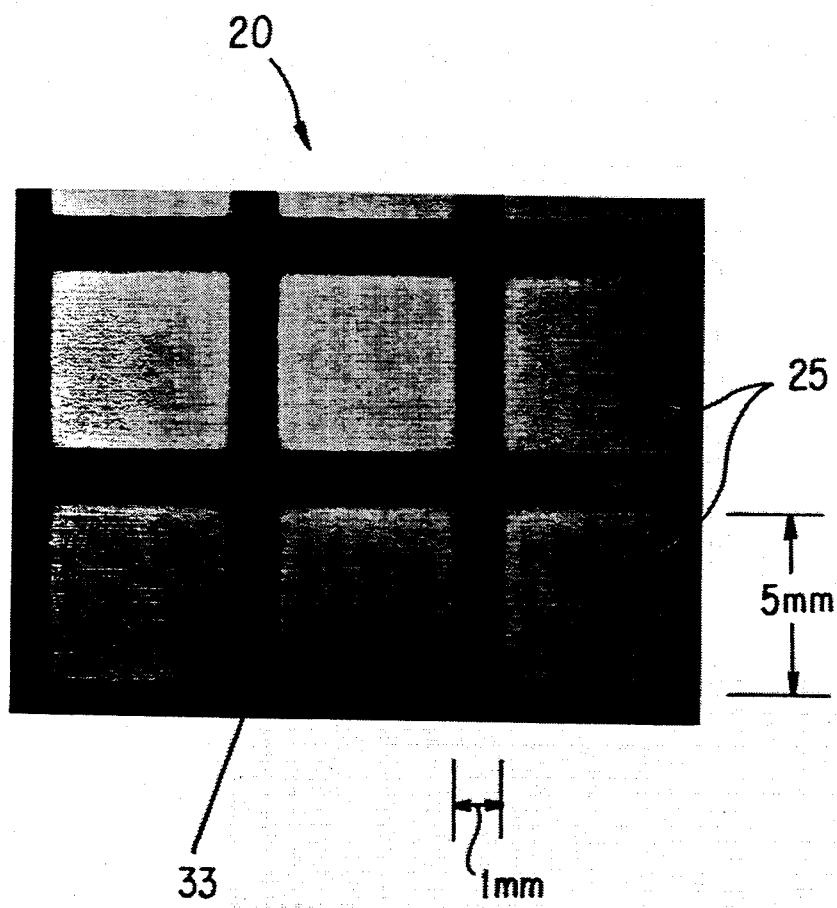
FIG. 1b is a microphotograph of a portion of a microelectronic structure according to the invention illustrating an array of laterally spaced apart diamond structures prior to formation of a semiconducting diamond layer on each structure.

Referring now to FIGS. 1a, 1b and 2, a first embodiment of the microelectronic structure 20 according to the present invention is illustrated. The microelectronic structure 20 includes a single crystal nondiamond substrate 21 having opposing top and bottom faces. A plurality of laterally spaced apart diamond structures 22 are formed on the substrate 21 extending outwardly therefrom. As illustrated in FIG. 1a, the diamond structures 22 are preferably arranged in an array pattern with predetermined spacings between laterally adjacent diamond structures. In addition, an interfacial carbide layer 23 is preferably formed between the plurality of diamond structures 22 and the nondiamond substrate 21. Moreover, the diamond structures 22 are substantially oriented with respect to the nondiamond substrate 21, that is, the diamond structures are preferably oriented with a tilt and azimuthal misorientation within a predetermined range to thereby provide a high quality device.

Referring to FIG. 1b, the microphotograph shows a plurality of diamond layers 25 formed on a substrate in an array pattern. The array is formed by patterning an $SiO_2$ layer 33 on the substrate and nucleating and growing diamond layers within respective squares opened through the $SiO_2$ layer as described in greater detail below.

Referring more particularly to the greatly enlarged schematic view of FIG. 2, an embodiment of a diamond structure 22 is illustrated. The diamond structure 22 includes a diamond layer 25, and a semiconductor device on an outermost face of the diamond layer. The semiconductor device preferably includes a layer of semiconducting diamond 27. In the illustrated embodiment, a source contact 28a, a drain contact 28b and a gate contact 28c and underlying gate insulator 28d are provided on the semiconducting diamond layer 27 to thereby define an FET. As also shown, an insulating filler layer 30, such as $SiO_2$, $AlO_3$, $Si_3N_4$, may be formed between laterally adjacent diamond structures 22.

As would readily be understood by those skilled in the art, the semiconducting diamond layer 27 may preferably be formed by homoepitaxial deposition of an additional layer on the diamond layer 25. Alternatively, the semiconducting diamond layer 27 may be formed by ion implantation or other doping techniques applied to an outer portion of the diamond layer 25.

As would also be readily understood by those skilled in the art, in addition to the FET illustrated, other semiconductor devices may also be formed on each diamond structure 22. The semiconductor devices may be connected in parallel to provide a relatively large power handling capability for the microelectronic structure 20 according to the present invention. Alternatively, the substrate 21 may be diced to produce a plurality of high quality diamond semiconductor devices.

The nondiamond substrate 21 may be single crystal silicon with a (100)-oriented outer face. The single crystal nondiamond substrate 21 may also preferably be copper, nickel or alloys thereof, with a titanium carbide interfacial layer 23 between the substrate and the diamond structures.

The nondiamond substrate 21 may be a single crystal substrate of a material having a relatively close lattice match to diamond, such as silicon carbide (SiC), crystalline nickel, or crystalline copper or may include a surface layer of a material, such as a refractory metal carbide, which supports diamond growth as described below in greater detail. By lattice matching, is meant that the layers are in atomic registry or that the crystal structures are substantially in alignment with each other. Lattice match relates to the difference between the lattice constant ("$a_0$") of diamond and the metal, and is typically expressed in terms of "lattice mismatch".

In addition, the substrate 21 may also be an insulating material or for certain applications, such as for a vertical semiconductor device, the substrate may be highly doped silicon or other electrically conductive material. For a highly doped silicon substrate 21, a back contact of a suitable conductive material, not shown, may also be provided on the substrate.

The diamond structures 22 preferably have a substantially flat outermost face having a (100)-orientation to thereby provide a relatively large useable area in contrast to other crystalline orientations. Accordingly, the diamond structures 22 preferably have outer face dimensions greater than about 20 $\mu m$ on a side, and may also have dimensions greater than 100 $\mu m$ on a side. The (100)-orientation is achieved by using a nondiamond substrate 21 with a (100)-oriented face and other techniques as described in greater detail below for favoring growth of the (100)-oriented grains.

Figure 3:
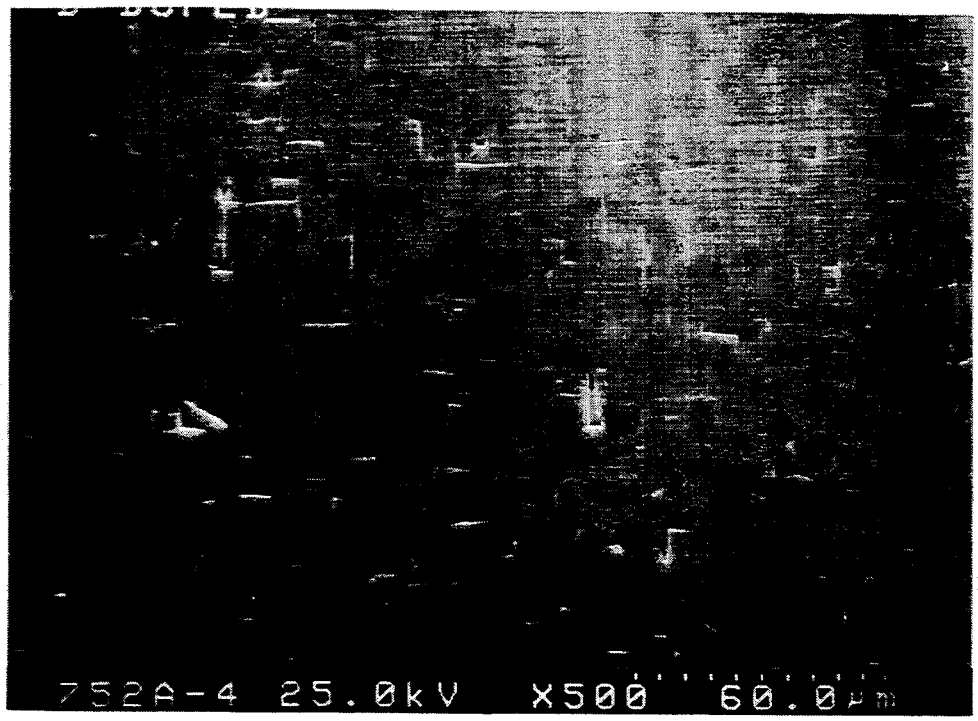
FIG. 3 is a planar microphotograph of a portion of an embodiment of a diamond structure according to the invention and as described in Example 1.
Figure 4:
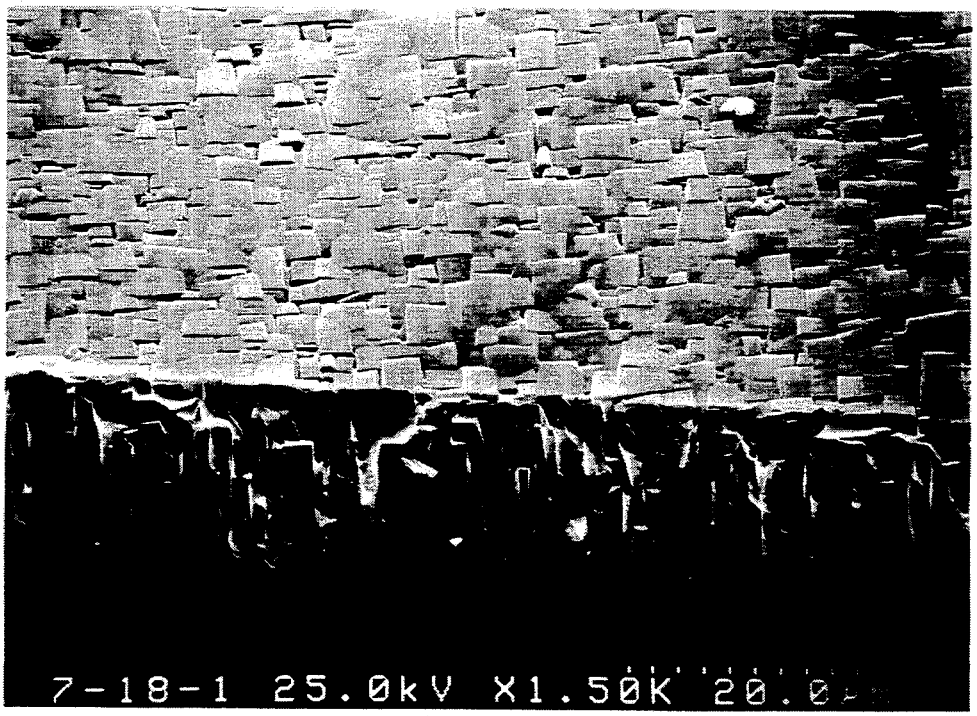
FIG. 4 is a cross-sectional microphotograph of the portion of the embodiment of the diamond structure according to the invention as shown in FIG. 3 and as described in Example 1.

Referring now to FIGS. 3 and 4 another aspect of the present invention is explained. The diamond structures 22 of the microelectronic structure 20 may each preferably be formed by a highly oriented textured diamond layer 25 as shown in FIG. 3 and 4. The highly oriented textured diamond layer 25 includes a plurality of side-by-side columnar single crystal diamond grains 32 extending outwardly from the substrate 21. Substantially all of columnar single crystal diamond grains 32 in each of the plurality of diamond structures is preferably oriented with a tilt and azimuthal misorientation of less than about 8°, and more preferably, less that about 5° relative to the single crystal nondiamond substrate 21. The highly oriented textured diamond layer 25 has its first major face adjacent the substrate 21 being substantially planar and devoid of any protrusions. The columnar single crystal diamond grains 32 at the second major face of the highly oriented textured diamond layer are substantially flush with adjacent faces to form an overall relatively flat second major face for the highly oriented textured diamond layer. In addition, the highly oriented textured diamond layer 25 when formed according to the method of the present invention has a relatively high nucleation site concentration at its first major face. Preferably the nucleation site concentration is greater than about $10^4/cm^2$, and more preferably, greater than about $10^5/cm^2$.

The highly oriented textured diamond layer 25 is high quality diamond superior to polycrystalline diamond for semiconductor applications and approaches single crystal diamond in performance. For example, a semiconducting diamond layer 27 (FIG. 2) on the outermost faces of the plurality of columnar single crystal diamond grains 32 preferably has a hole mobility of greater than about 100 $cm^2/V$-s and, more preferably, greater than about 300 $cm^2/V$-s based upon a boron dopant level of about $10^{18}$ at room temperature. These values for hole mobility are substantially higher than the highest reported values for polycrystalline films, and are comparable to hole mobilities for homoepitaxial layers grown on single crystal diamond substrates, that is, about 300–400 $cm^2/V$-s.

The diamond structures 22 (FIGS. 1a and 1b) may be formed in an array pattern by masking the substrate 21 and growing the highly oriented textured diamond layers 25 within the unmasked portions. Alternately, a layer of highly oriented textured diamond 25 may be formed covering the entire substrate 21. This highly oriented layer may then be etched to form the spaced apart diamond structures 22 as shown. As would be readily understood by those skilled in the art, the highly oriented textured diamond layer 25 according to another aspect of the invention may also be used for applications where a high quality diamond film is desirable without requiring that the layer be formed into the array of spaced apart diamond structures 22.

Figure 5:
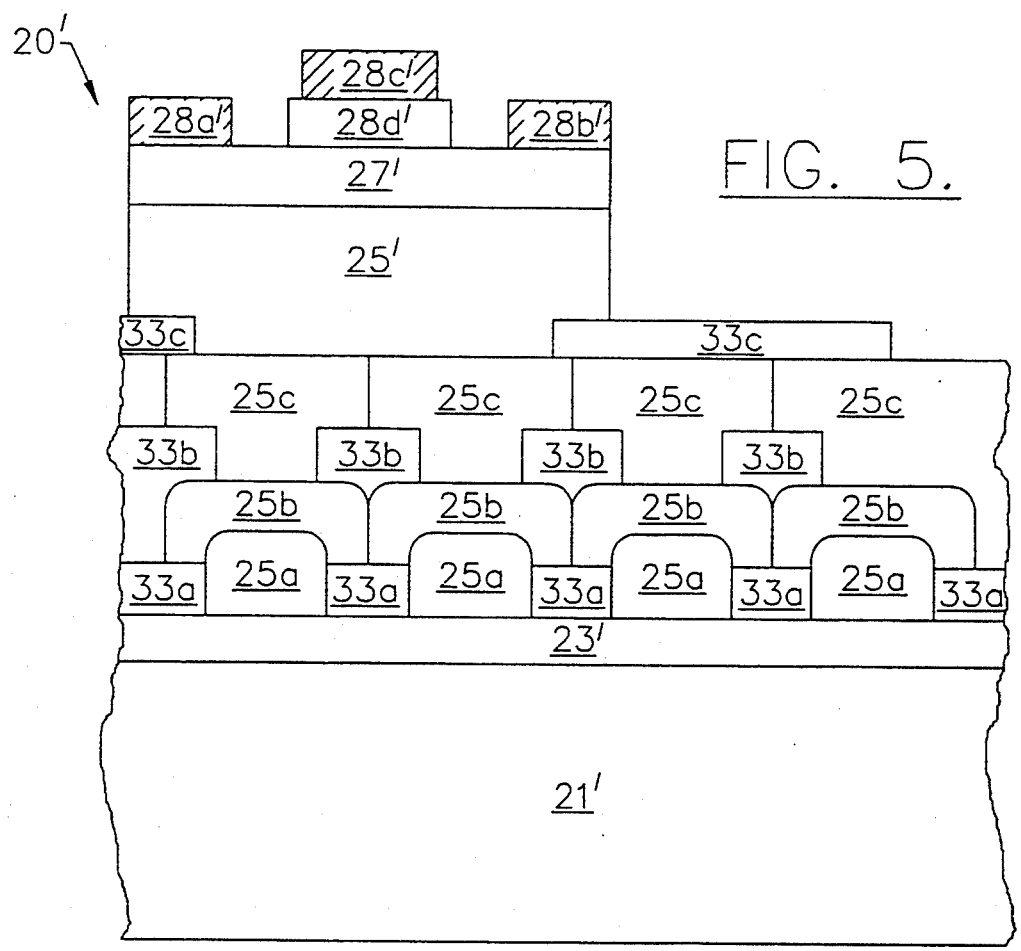
FIG. 5 is a greatly enlarged schematic cross-sectional view of a portion of another embodiment of a microelectronic structure according to the invention.

Referring now to FIG. 5, another embodiment of the microelectronic structure 20' according to the invention is explained. The microelectronic structure 20' includes successive diamond layers formed on a single crystal nondiamond substrate 21'. The first layer is preferably produced by forming a mask layer 33a thereby exposing predetermined areas of the nondiamond substrate 21'. Diamond seeds 25a may then be positioned into the exposed areas. Diamond is then deposited onto the seeds 25a to produce a layer of diamond grains 25b. A layer of larger single crystal diamond grains 25c may then be formed by a second masking layer 33b followed by further diamond deposition. In the illustrated embodiment, a third or outermost layer is formed including a plurality of even larger single crystal diamond grains 25' by using a third mask 33c and depositing diamond onto the underlying diamond grains 25c. See, for example, a publication entitled *Production of Large-Area Mosaic Diamond Films Approaching Single-Crystal Quality* by Geis et al., paper presented at the Electrochemical Society Meeting in Washington, D.C., May 6–10, 1991, and an article by Geis entitled *Device Quality Diamond Substrates* appearing in Diamond and Related Materials, I, pp. 684–687 (1992).

In other words, this embodiment of the microelectronic structure 20' includes successive diamond layers formed having progressively larger single crystal grain sizes 25a, 25b, 25c, and 25'. The single crystal diamond grains are oriented with respect to grains in adjacent diamond layers. The outermost layer includes a plurality of spaced apart single crystal diamond grains 25' upon which a semiconductor device including a semiconducting diamond layer 27' and respective contacts 28a', 28b', and 28c' and insulating layer 28d' may be formed to produce an FET, as in the illustrated embodiment. An optional layer of insulating filler material, not shown, may also be formed between laterally adjacent diamond grains 25' of the outermost-layer.

The outer face dimensions of the single crystal diamond grains 25' of the outermost layer are preferably greater than about 20 μm on a side, and more preferably, greater than about 100 μm on a side. The substrate 21' may also be a single crystal substrate as described above with respect to the first embodiment of the invention having a predetermined orientation so that the single crystal diamond grains 25' of the outermost layer are (100)-oriented.

Figure 6:
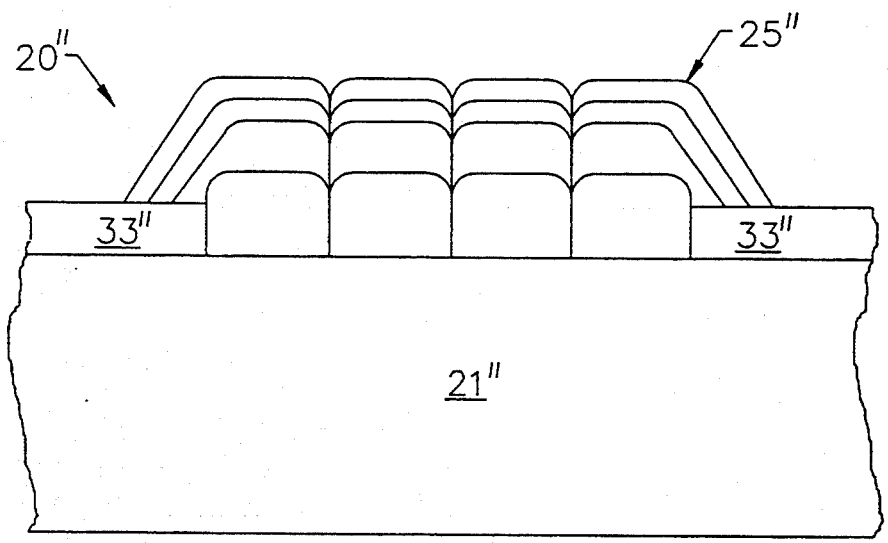
FIG. 6 is a greatly enlarged schematic cross-sectional view of a portion of another embodiment of a microelectronic structure according to the invention.

A portion of a third embodiment of the microelectronic structure 20" according to the invention is shown in FIG. 6. This embodiment includes a diamond structure 25" formed by selective area deposition of diamond in an exposed area of the substrate 21" defined by a mask layer 33". See, for example, a publication entitled *Selected-Area Deposition of Diamond Films* by Inoue et al., Journal of Applied Physics, Vol 67, No. 12, 15 June 1990, pp. 7329–7336, the disclosure of which is incorporated herein by reference. The mask material may preferably be $SiO_2$, $AlO_3$, or $Si_3N_4$ or other conventional masking material formed using a conventional deposition technique, such as sputtering or CVD. Successive diamond layers are preferably deposited on the masked substrate such as by chemical vapor deposition. The chemical vapor deposition of diamond may be performed by a conventional deposition technique, such as microwave plasma enhanced CVD, combustion flame deposition, or hot filament deposition.

Figure 7:
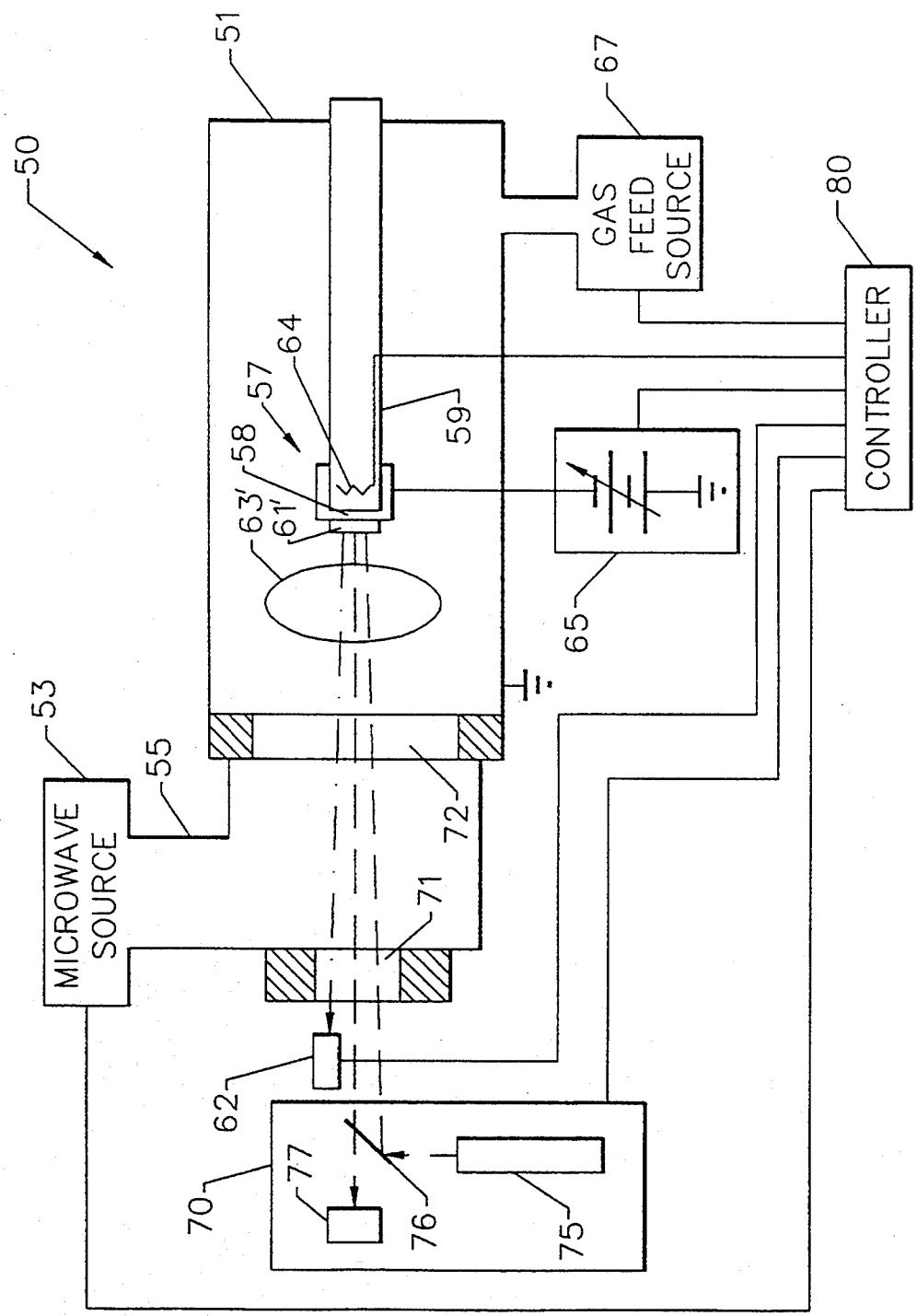
FIG. 7 is a schematic diagram of an apparatus for making the microelectronic structure according to the invention.
Figure 8:
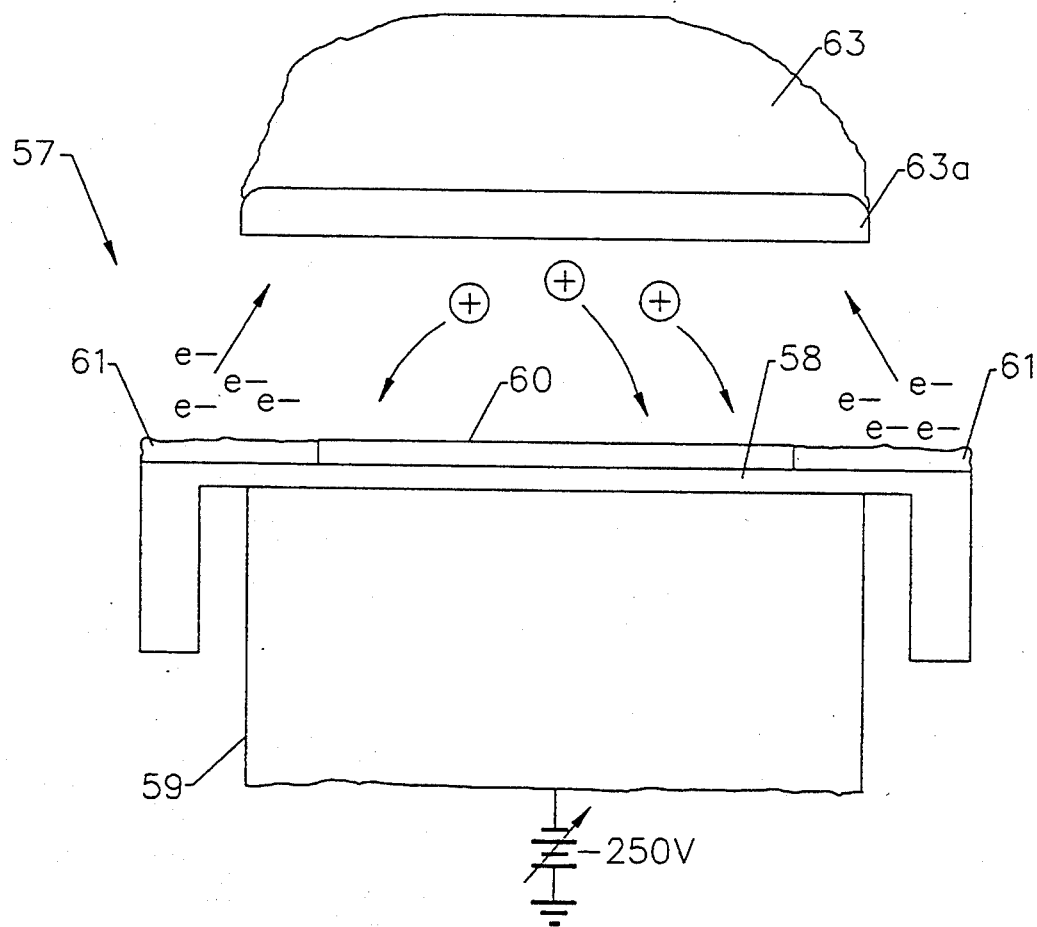
FIG. 8 is a greatly enlarged schematic cross-sectional view of a portion of the substrate holder and plasma as shown in FIG. 7.

Referring now to FIGS. 7 and 8, the CVD apparatus and associated method for making the highly oriented textured diamond layer 25 (FIGS. 3 and 4) for the microelectronic structure 20 is explained. The CVD apparatus 50 preferably includes a conventional CVD reactor 51, such as an ASTeX microwave plasma CVD reactor available from ASTeX Company of Woburn, Mass. The apparatus 50 has a controllable microwave power source 53 coupled to the reactor 51 by a rectangular waveguide section 55 to generate a plasma 63 within the reactor for microwave plasma enhanced CVD. The microwave power source 53 may be an ASTeX S-1000, 2.45 GHz microwave supply. The reactor 51 further includes a retractable substrate holder 57 positioned therein. A substrate 60 to be processed is positioned on the substrate holder 57 and a heater 64 (e.g., a tantalum heater) associated with the substrate holder is used to control the substrate temperature independent of the plasma power. The temperature of the substrate 60 may be measured by a conventional optical pyrometer 62.

The plasma 63 forms at a stable position in a medial portion of the reactor 51. The substrate 60 position relative to the plasma 63 may be varied between 0 (immersed in the plasma) and 8 centimeters by moving the retractable substrate holder 57 with respect to the reactor 51. The substrate holder 57 is connected to a controllable DC power supply 65 in the illustrated embodiment to electrically bias the substrate holder 57 with respect to ground. Alternately, the substrate holder may be isolated from ground so that it is at a floating electrical potential, or the substrate holder may be connected to ground, such as during growth of diamond on the pretreated substrate.

Other electrical bias power supplies may be used in addition to the illustrated DC power supply 65 which provides a pure DC bias. For example, a conventional pulsed-DC power supply, AC (60 Hz) power supply, or RF power supply may also be used to bias the substrate holder 57.

A conventional gas feed source 67, including a vacuum pump and/or other conventional process pumps, are connected to the reactor 51. The gas feed source 67 controls the pressure within reactor 51 and the gas flow rate, as well as the mixture of feed gasses.

Referring now to the greatly enlarged view of a portion of the substrate holder 57 as shown FIG. 8, another aspect of the present invention will now be explained. The substrate holder 57 includes a substrate holding platform 58, such as a molybdenum cap, secured to the end of a tubular body 59, as would be readily understood by those skilled in the art. According to the invention, the substrate platform 58 includes a diamond film 61 on a predetermined portion thereof. As illustrated, the diamond film 61 preferably includes an opening extending vertically therethrough having a circular cross-sectional shape to receive therein a conventional circular substrate 60. Thus, the diamond film 61 is in the form of a ring that is laterally adjacent and laterally surrounds the substrate 60. Accordingly, both the diamond film 61 and the substrate 60 may be readily exposed to the plasma 63.

The diamond film 61 may also coat the entire substrate platform 58. In other words, the diamond film may also extend along the surface of the substrate platform 58 beneath the substrate 60. Other positions for the diamond film are also possible as long as the diamond film is connected to the bias power supply 65 and is exposed to the plasma 63 within the reactor 51. Exposed to the plasma 63 means that the diamond film 61 and the substrate 60 are immersed in the plasma glow region, or more typically, positioned contiguous with the plasma sheath region which in turn is below the plasma glow region.

As shown in FIG. 8, the majority of the current is believed to be supplied by electrons e− emitted from the diamond film 61, as opposed to ions $\theta$ accelerated towards the substrate 60. Without wishing to be bound thereto, applicants theorize that the diamond film 61 contributes to the enhancement of diamond nucleation by either of two mechanism. First, since the diamond film 61 appears to become depleted over time, it is possible that the diamond is being chemically transported from the diamond film 61 to the substrate 60. In other words, it is possible that diamond is being moved from the diamond film 61 to the substrate 60 via an etching and deposition process.

Another theory is that increased gas phase dissociation is caused by electron e− emission from the diamond film 61 and the higher concentration of dissociated hydrocarbons are being created by this electron dissociation process. It was also observed that under higher biases, a lower region of the plasma 63a began to appear red, indicative of increased hydrogen dissociation. If hydrogen dissociation is increased, then, hydrocarbon dissociation should increase as well. It is therefore theorized that a higher concentration of dissociated hydrocarbons, as required for diamond nucleation, are being created via this electron dissociation process.

Referring again to FIGS. 1a–8, a method according to the present invention for making a plurality of semiconductor diamond devices on a single crystal nondiamond substrate 21 is explained. More particularly, the method includes the steps of forming a plurality of laterally spaced apart diamond structures 22 on the single crystal nondiamond substrate 21 so that each of the diamond structures has an outermost face being substantially oriented relative to the single crystal nondiamond substrate, and forming a respective semiconductor device on each of the plurality of diamond structures (FIGS. 1a, 1b and 2). The step of forming each of the semiconductor devices preferably includes forming a source 28a, a drain 28b, and a gate 28c, 28d on the semiconducting diamond layer 27 thereby defining a field effect transistor.

If desired, the substrate 21 may then be diced to separate the plurality of semiconductor devices into discrete devices. Dicing is very efficient and economical and may be readily achieved using conventional cutting tools, since the substrate material between the diamond structures is a nondiamond material.

One embodiment of the method includes forming a plurality of laterally spaced apart highly oriented textured diamond layers 25 (FIGS. 1b, 2 and 3), each including a plurality of side-by-side columnar single crystal diamond grains 32 extending outwardly from the nondiamond substrate 21. The columnar single crystal diamond grains 32 are preferably formed so as to be oriented with a tilt and azimuthal misorientation of less than about 8°, and more preferably, less that about 5° relative to the single crystal nondiamond substrate 21. The step of forming the plurality of columnar single crystal diamond grains 32 preferably includes carburizing a face of the substrate, nucleating the carburized substrate face with diamond with the biased assisted pretreatment, and depositing diamond onto the nucleated substrate face.

The step of nucleating the carburized substrate face preferably includes exposing the substrate face 60 to a carbon-containing plasma 63 while electrically biasing a diamond layer 61 adjacent the substrate face and also exposed to the plasma (FIGS. 7 and 8). The electrically biasing is preferably carried out at a peak absolute value of not less than about 250 volts negative with respect to ground. The electrical bias supplied may be pure DC, pulsed DC, alternating current (AC 50 or 60 Hz), or radio frequency (RF), as long as at least a portion of the electrical bias waveform is not less than about −250 volts.

The step of exposing both the nondiamond substrate 60 and the adjacent diamond layer 61 to the carbon-containing plasma 63 preferably includes exposing both to the carbon-containing plasma having an atomic percentage of carbon of not more than about 0.3 atomic percent, such as provided by a methane gas plasma mixture having a percentage of methane of not more than about 5 percent by weight, and more preferably, not more than about 2 percent methane by weight. Other carbon-containing gasses may also be used including those selected from the group consisting of ethane, ethylene, acetylene, acetone, ethanol, carbon dioxide, $CCl_4$, $C_2Cl_4H_2$, $CCl_3CF_3$, $CCl_3CH_2OH$ inclusive of aliphatic hydrocarbons with from about 1 to about 10 carbon atoms per molecule.

The pretreatment is preferably carried out for a predetermined time, such as for at least about 1 hour to 2 hours for a high nucleation density and with an electrical bias of about 250 volts negative with respect to ground. The time period roughly equates to the start of the diamond growth on the substrate. It has also been found that the electrical bias should be discontinued after pretreatment in order to grow a high quality diamond film.

A further aspect of the invention is that the highly oriented textured diamond film 25 may be formed on a substrate 21 having a surface film of a material with a relatively close lattice match with diamond selected from the group consisting of refractory metals and their carbides, cubic-boron nitride, $\alpha$-silicon carbide, $\beta$-silicon carbide, copper, and nickel. An exemplary refractory metal carbide is titanium carbide. The term "refractory metal" relates to a metal which exhibits refractory properties, namely a metal characterized by its ability to withstand extremely high temperatures (i.e., temperatures greater than about 1500° C.). Exemplary refractory metals are transition element metals, and preferably are selected from the group consisting of Group IV, V and VI transition element metals (CRC Handbook, 71st Ed.). Exemplary refractory metals include titanium, tantalum, tungsten, molybdenum, hafnium and niobium. The surface film of such a substrate is preferably pretreated as described above, however, the electrical biasing is preferably carried out for a shorter time of not more than about 30 minutes at an absolute value of not less than about 250 volts negative with respect to ground to prevent damage to the substrate surface film.

The face of the substrate 60 (FIGS. 7 and 8) may also preferably be optically monitored and the electrical biasing discontinued responsive to a change in the substrate indicative of the start of growth of a diamond film on the substrate. For example, laser reflection interferometry (LRI) or optical pyrometry may be used to monitor the face of the substrate as would be readily understood by those skilled in the art. Then, diamond is preferably deposited onto the substrate while controlling processing conditions to favor growth of diamond having a (100)-oriented outer face.

This embodiment of the method according to the present invention provides nucleation of an array of diamond structures 22 (FIGS. 1a–4), each approaching single crystal quality, without requiring scratching or abrading of the surface of the substrate. The relative smoothness of the substrate surface produced by the method according to the present invention permits LRI to be used during the diamond growth process so that real time control of the growth processing parameters is possible (FIGS. 7 and 8).

LRI requires a relatively smooth surface to avoid surface scattering and the commensurate drop in reflected intensity. Current alternatives to LRI usually involve ex-situ analysis such as cross-sectional SEM or profilometry. LRI permits changes in growth to be continuously monitored while a diamond deposition is in progress; thus, changes in these rates during a deposition, either due to purposeful changes in growth parameters or accidental changes due to unforeseen problems can be determined and the processing parameters adjusted accordingly.

LRI operates by the simple superposition of two light waves from both the top surface of the growing diamond film, as well as the interface between the film and the substrate see, for example *"Optical Characterization Techniques for Semiconductor Technology,"* by Olson et al., SPIE, Vol. 276, p. 128 (1981). The light waves add and as the film continues to grow there is a cycling of the intensity due to the alternating periods of both constructive and destructive interference. For monochromatic light the growth rate (R) may be calculated as:

$$R = (\lambda/2\eta)/T,$$

where $\lambda$=wavelength of the laser light, $\eta$=index of refraction of the diamond film, and T=period between interference cycles. For CVD diamond, an index of refraction of natural diamond may be used ($\eta=2.4$). Since this index may vary with the quality of diamond, it may be necessary to adjust the value of $\eta$ utilizing a series of calibration experiments. This may be accomplished by performing depositions to cover the desired extremes in relative quality as determined by some independent technique, such as Raman spectroscopy. Next the thicknesses of the films are measured and compared to those calculated from LRI. One may then solve for $\eta$ in the above equation to determine the index of refraction at those extremes.

During pretreatment there is a period of time during which no diamond growth is detected. LRI permits one to directly observe and account for this nucleation period. During the nucleation period, the reflected intensity is relatively flat, but as soon as the diamond film begins to grow, there is a noticeable decrease in the reflected intensity. Applicants theorize without wishing to be bound to any theory, that this initial drop in reflectivity is due to the absorption of light by the surface film of carbon which is deposited during the pretreatment period. When this drop in intensity is observed, the pretreatment may be stopped and standard diamond growth allowed to begin. Discontinuing the bias voltage thus allows the substrate to have a floating potential. It has been found that if the bias voltage is maintained, then the carbon film will continue to grow, followed by a poorer quality diamond than in the case where the bias voltage is discontinued. LRI makes it possible to measure the nucleation period, as well as the diamond film growth rate, either of which may vary with changes in processing parameters.

Applicants theorize, without wishing to be bound thereto, that the relatively high electrical bias of the present invention creates a higher saturation of diamond growth (carbon) species and thus helps to stabilize the existing nuclei already formed on the substrate. Applicants also theorize that the lower concentration of the carbon-containing gas (e.g., not more than about 5 percent by weight for methane, and preferably not more than about 2 percent by weight methane) during the pretreatment produces a better quality diamond. As the methane concentration is increased for example, more undesirable graphite and amorphous carbon may be incorporated into the diamond.

From initial in-vacuo surface analytical measurements coupled with a growth series, little, if any, graphite is formed on the substrate surface if low methane concentrations are used. In contrast, a higher methane (and higher carbon) concentration is likely to form graphite in the early stages of the biasing during the pretreatment. Additionally, if diamond then nucleates on the graphite, the adhesion of the diamond film to the substrate is likely to be very poor. It is further theorized that the relatively long pretreatment time of one to two hours for a mirror finished silicon substrate may give the silicon carbide interfacial film a chance to partially crystallize, thus improving the integrity of the interfacial film.

A variation of the method for forming a plurality of diamond structures includes the steps of forming a highly oriented textured diamond layer 25 including the plurality of side-by-side columnar single crystal diamond grains 32 extending outwardly from the nondiamond substrate 21 and substantially covering the substrate face, and etching the highly oriented textured diamond layer 25 to produce the plurality of laterally spaced apart diamond structures. In other words, the highly oriented textured diamond layer may be formed covering the substrate. Then the covering diamond layer may the be patterned and etched to yield the plurality of laterally spaced apart diamond structures, such as for permitting dicing into discrete semiconductor devices.

An alternate method according to the invention includes forming a plurality of single crystal diamond grains 25' as the laterally spaced apart diamond structures (FIG. 5). A plurality of successive diamond layers are formed on the substrate 21' wherein single crystal diamond grains 25a, 25b, 25c and 25' of each layer are preferably substantially oriented with respective single crystal diamond grains of an adjacent layer. Selective masking is preferably used to produce successive diamond layers wherein the single crystal diamond grains have progressively increasing outer face dimensions in successive layers extending outwardly from the nondiamond substrate 21.

Another method for forming the plurality of laterally spaced apart diamond structures 25' includes positioning a plurality of single crystal diamond seeds on the nondiamond substrate, and forming successive diamond layers on the seeded substrate (FIG. 5). The single crystal substrate 21' may first be etched using conventional techniques to form aligned etch pits into which diamond seeds are placed. Diamond is then deposited onto the seeds as disclosed in a publication entitled *Production of Large-Area Mosaic Diamond Films Approaching Single-Crystal Quality* by Geis et al., from a paper presented at the Electrochemical Society Meeting in Washington, D.C., May 6–10, 1991, and also an article by Geis entitled *Device Quality Diamond Substrates* appearing in Diamond and Related Materials, I, pp. 684–687 (1992).

Alternately, the layer of single crystal diamond grains may be formed by selective area deposition on a substrate 21'' to form an array of unmasked areas onto which diamond is then deposited (FIG. 6). As would be readily understood by those skilled in the art, the diamond may be deposited by plasma assisted CVD, molecular beam epitaxy, hot filament assisted growth, or flame torch methods.

According to another aspect of the method for making the microelectronic structure 20, a laser reflection interferometer 70 may be positioned outside of the reactor 51 so that a laser beam may be directed through a pair of spaced apart view ports 71, 72 to the surface of the substrate 60, reflected from the substrate, and back to the interferometer 70. The laser reflection interferometer 70, as would be readily understood by those skilled in the art, includes a laser 75, a beam directing prism 76, and an optical detector 77. The laser may be a helium-neon laser with a wavelength of 630 nanometers.

The laser reflection interferometer 70 is coupled to a controller 80, such as a computer or microprocessor, operating under stored program control. The laser reflection interferometer 70 may be used in-situ to monitor the growth of a diamond film on the substrate 60 after the substrate has been pretreated to achieve high diamond nucleation density. For example, the quality of the diamond film may be determined by the intensity of the reflected beam. As would be readily understood by those skilled in the art, both surface roughness and clarity are indications of the quality of the diamond film.

The rate of growth of diamond may also be readily monitored by the apparatus 50 as would be readily understood by those skilled in the art. The controller 80 may be coupled to other controllable components of the apparatus 50 so that real time corrections may be made to the processing parameters during the growth of the diamond film.

The following examples are illustrative of the highly oriented textured diamond film of the present invention and are not intended to be limiting of the invention.

EXAMPLE 1

Diamond films were grown in a stainless steel microwave plasma chemical vapor deposition (CVD) reactor, purchased from Applied Science and Technology (ASTeX ™). The chamber was modified to allow for in-situ biasing as shown in FIGS. 7 and 8. Both the bias-enhanced nucleation (BEN) and growth processes were carried out in the same reactor, one immediately following the other. The BEN process has been discussed in detail in parent Application Ser. No. 07/937,481 and involves placing a negative DC bias on the conducting substrate holder, immersed in a methane/hydrogen plasma.

Standard diamond growth conditions are used during the biasing, with the methane concentration between 1–5% in hydrogen and the pressure ranging between 10 to 25 torr. DC voltages of 100–300 volts are used with induced currents ranging from 50–500 mA depending upon the size of the substrate holder. The actual pretreatment, biasing and growth conditions used in this study are listed in Table 1 below:

TABLE 1

| | 3-step process for oriented (100) textured diamond | | |
|---|---|---|---|
| PARAMETERS | PRETREATMENT | BIAS NUCLEATION | GROWTH |
| Bias Voltage (VDC) | — | 170–200 V | — |
| Bias Current (mA) | — | 300–400 mA | — |
| μ-wave Power (watts) | 1000 W | 1000 W | 1300 W |
| Pressure | 20 T | 20 T | 35 T |

TABLE 1-continued

3-step process for oriented (100) textured diamond

| PARAMETERS | PRETREAT-MENT | BIAS NUCLEATION | GROWTH |
|---|---|---|---|
| (torr) | | | |
| Gas Flow Rates (sccm) | | | |
| $H_2$ | 300 sccm | 300 sccm | 180 sccm |
| $CH_4$ | 6 sccm | 6 sccm | 15 sccm |
| CO | — | — | 5 sccm |
| Heater Temp. (°C.) | 800° C. | 800° C. | 650° C. |
| Time | 3 hrs. | 15 min. | 10–40 hrs. |

This study was carried out in three stages. The first stage was to optimize the percentage of oriented diamond nuclei on silicon substrates. It was assumed that the greater the degree of orientation, the easier it would be to obtain a completely (100)-textured and oriented film. The second stage was to reproduce the results reported by Wild et al., "*Electrocham. Soc. Proc.*" 91-8, 224 (1991), Wild et al., Presented at the 2nd Int. Conf. on Diamond Materials, ECS Spring Meeting (Washington, DC. May 1991) and Wild et al., "*J. Appl. Phys.*", 68, 973 (1990) by growing a randomly oriented film out under conditions that would result in a highly textured (100) film. The final step was to combine the two processes together to nucleate an oriented film and then grow it out such that the resulting film was both (100)-textured and oriented relative to the substrate.

The goal of stage one was to maximize the number of epitaxially oriented diamond grains that are nucleated during the biasing process. As shown in Table 1, the biasing step is preceded by a carburization step that is speculated to form an epitaxial SiC conversion layer on the surface of the silicon. In the absence of this carburization step, an amorphous SiC interfacial layer may be formed prior to diamond nucleation, thus possibly destroying the crystallographic registry across the interface. The carburization is therefore an important step and was a focus of the first stage of this example.

A statistical experiment design was used to optimize the texturing process in stage two. Since substrate temperature and gas phase composition have been reported to have the greatest effect on diamond texture, a two parameter experiment design with these two as variables was used to determine the operating region that would produce high quality (100)-textured material at the highest rate. For this stage, epitaxy or orientation of the nuclei was not a concern. It was only necessary to grow the films under conditions that would result in a (100)-textured surface (i.e. not necessarily azimuthally aligned). The pretreatment and growth conditions used in this stage of the study are listed in Table 2 below.

TABLE 2

Bias and growth parameters for texturing SED

| PARAMETERS | BIAS NUCLEATION | TEXTURED GROWTH |
|---|---|---|
| Bias Voltage (VDC) | 200 V | — |
| Bias Current (mA) | 400 mA | — |
| μ-wave Power (watts) | 800 W | 1300 W |
| Pressure (torr) | 15 T | 50, 35 T (total carbon gas = 20 sccm) |
| Gas Flow Rates (sccm) | | |
| $H_2$ | 300 sccm | 180 sccm |
| $CH_4$ | 6 sccm | vary between 5–15 sccm |
| CO | — | 20 sccm-$CH_4$ flowrate |
| Heater Temperature (°C.) | 700° C. | 650–750° C. |
| Time | 25 min. | 10–40 hrs. |

The total gas flow was kept constant at 200 sccm and the concentration of carbon-containing gas was maintained at 10% (or 20 sccm). Methane ($CH_4$) and carbon monoxide (CO) were used as the carbon containing gases. With the total flow of carbon containing gases held constant at 20 sccm, the $CH_4$ flowrate was varied from 5 to 15 sccm with the remainder of the carbon gas flow being CO. Substrate heater temperature was varied at between 650° and 750° C. as measured by a thermocouple placed underneath the molybdenum substrate holder. The true substrate temperature, as measured by an optical pyrometer, was found to be approximately 100 degrees higher than that measured by the thermocouple. The pressure was held constant at 50 torr for the experimental design, and then later reduced to 35 torr to improve the substrate uniformity as discussed below.

A standard bias pretreatment was used to sufficiently nucleate the substrate which was then followed by the growth period. This biasing step was used to obtain a sufficiently high diamond nucleation density on which to perform the texturing selective deposition (SED) and was not expected to result in epitaxially oriented nuclei. Thus, the bias-parameters are those which in the past have resulted in nucleation densities, of random crystallites, in excess of $10^9$ per $cm^2$.

Once stages one and two had been completed, the two were applied in series as listed in Table 1. The carburization pretreatment was followed by the BEN step which was immediately followed by the growth process under the parameters chosen for optimized texture. The films in this study were growth on 2-inch (100)-oriented silicon wafers and were subsequently characterized by SEM and Raman spectroscopy.

Figure 9:
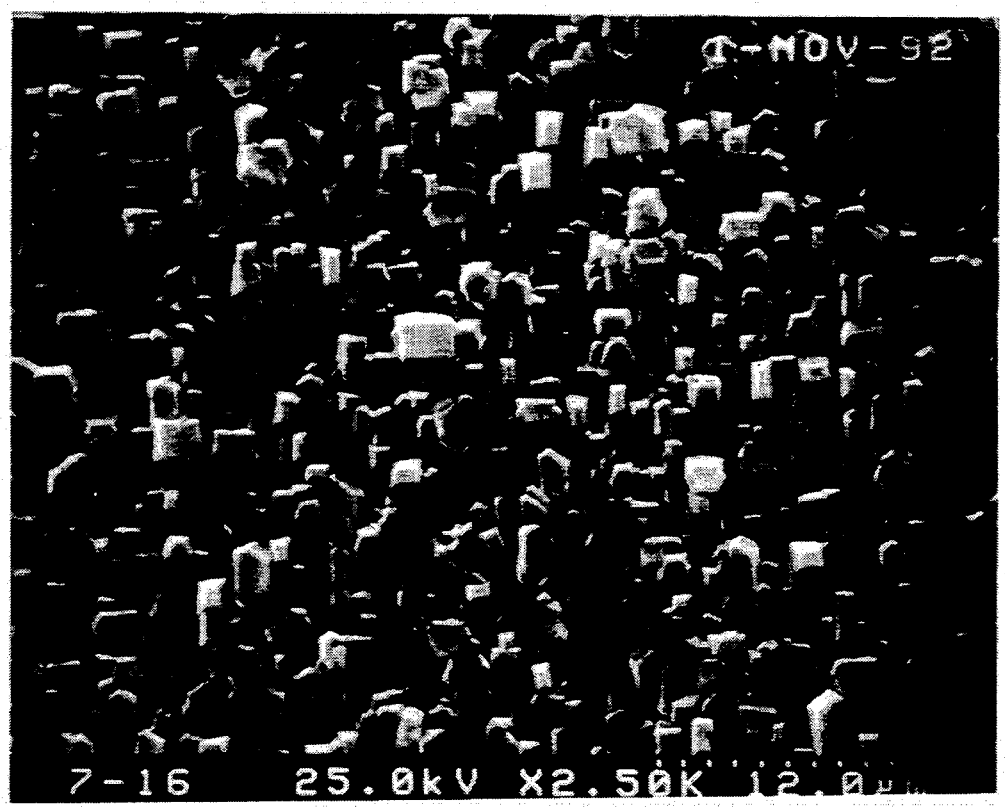
FIG. 9 is a microphotograph of a partially oriented diamond film on silicon following carburization and bias enhanced nucleation steps, as described in Example 1.

Optimizing the carburization and BEN steps results in a film where approximately 50% of the diamond grains were in epitaxial alignment with respect to the substrate across the 1-inch inner diameter of the 2-inch diameter wafer. FIG. 9 shows the partially oriented diamond film resulting from just the carburization and bias steps listed in Table 1 and followed by 5 hours of standard growth of high quality diamond that was not expected to result in preferential texturing.

It is evident that a large percentage of the diamond nuclei are aligned with the (100) faces parallel to the substrate and their <110> directions parallel to each other. Upon closer examination, it was determined that the diamond <110> directions are parallel to the silicon <110>, thus indicating that the oriented diamond crystals are in an epitaxial relationship relative to the substrate.

Figure 10:
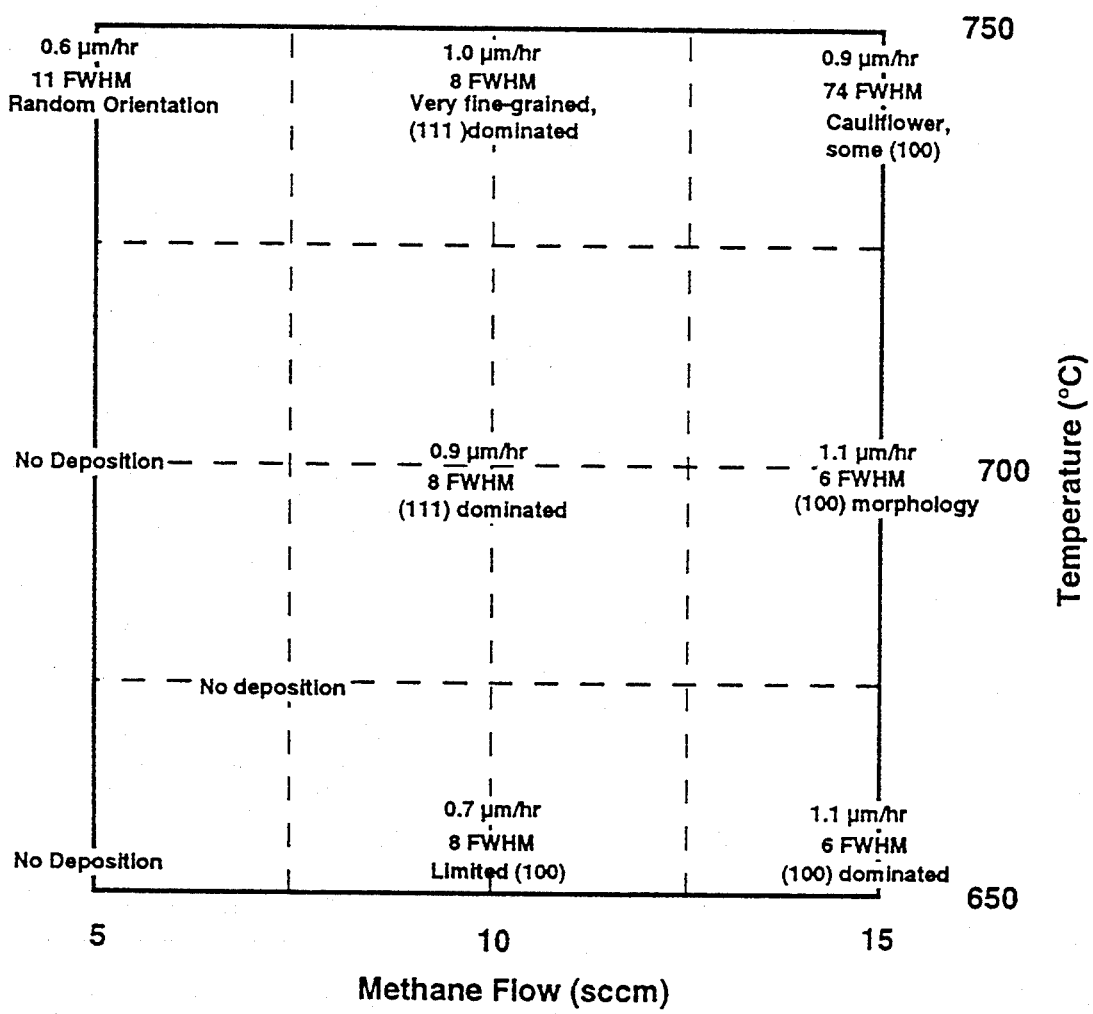
FIG. 10 is a schematic representation of the parameter space used for optimization of the textured growth stage, indicating the growth rate, Raman full width at half maximum (fwhm), and texturing morphology at each point, as described in Example 1.
Figure 11A:
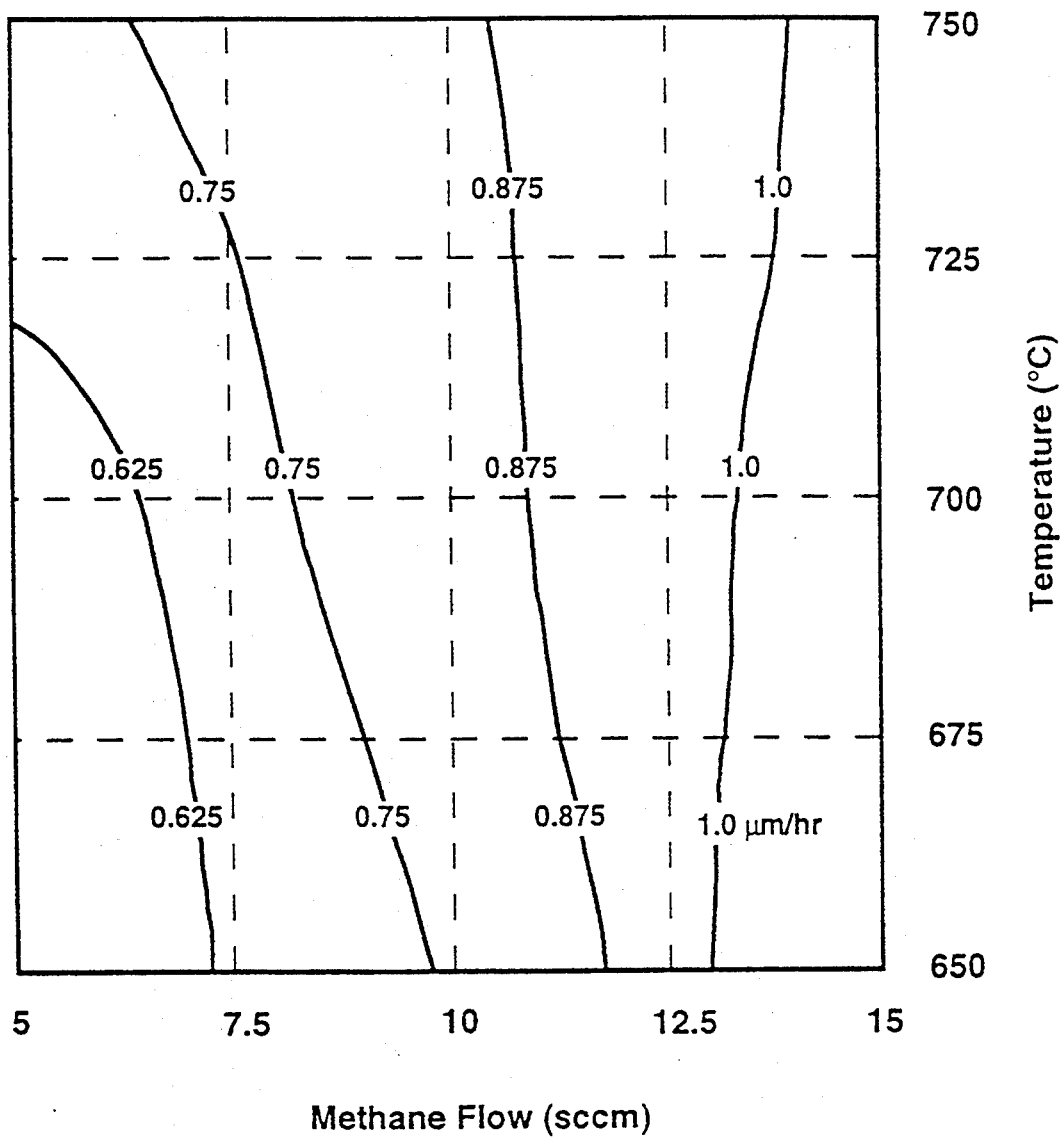
FIGS. 11a and 11b are graphs of contour plots for growth rate and fwhm, respectively, as described in Example 1.
Figure 11B:
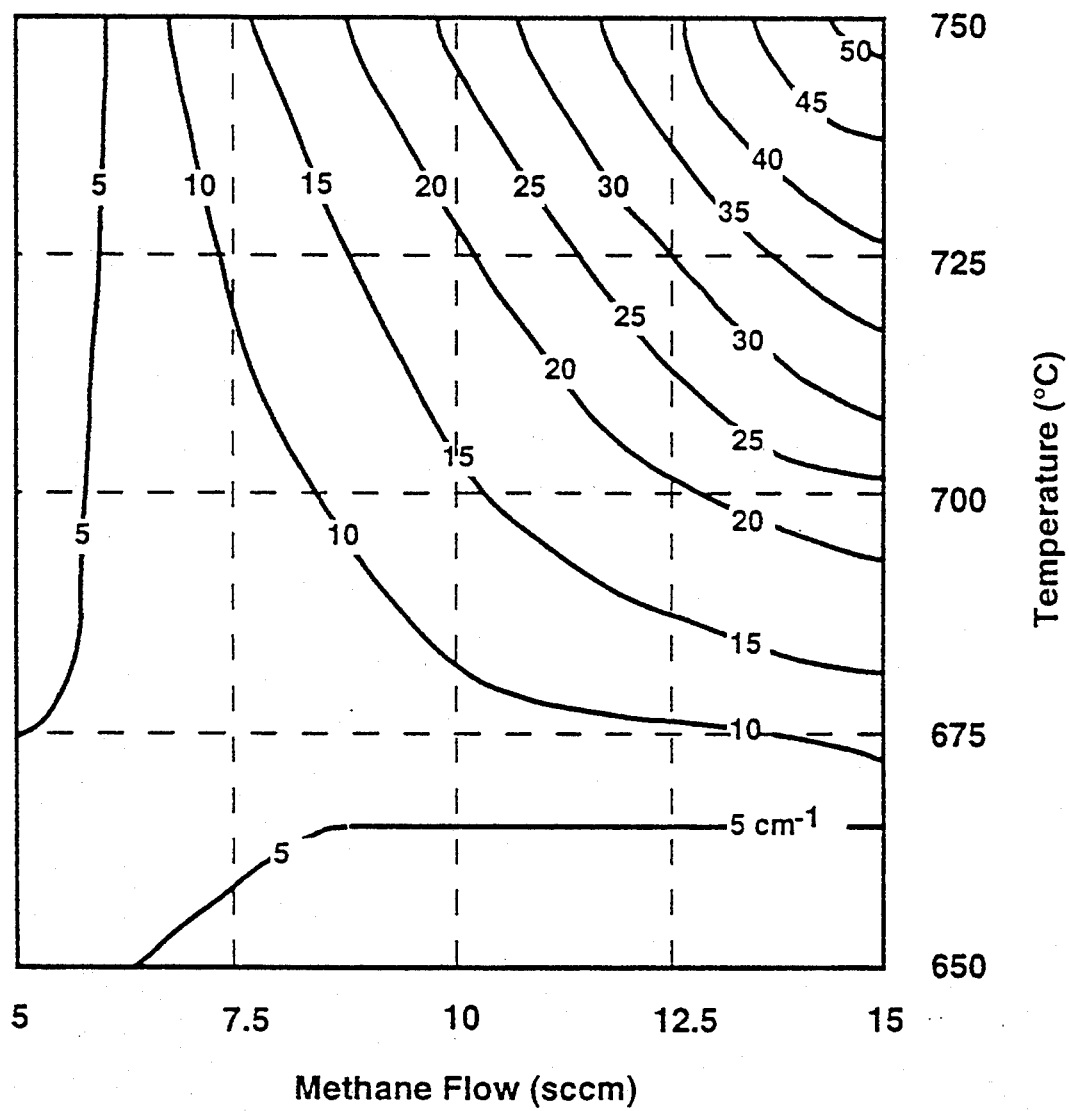
Figure 11C:
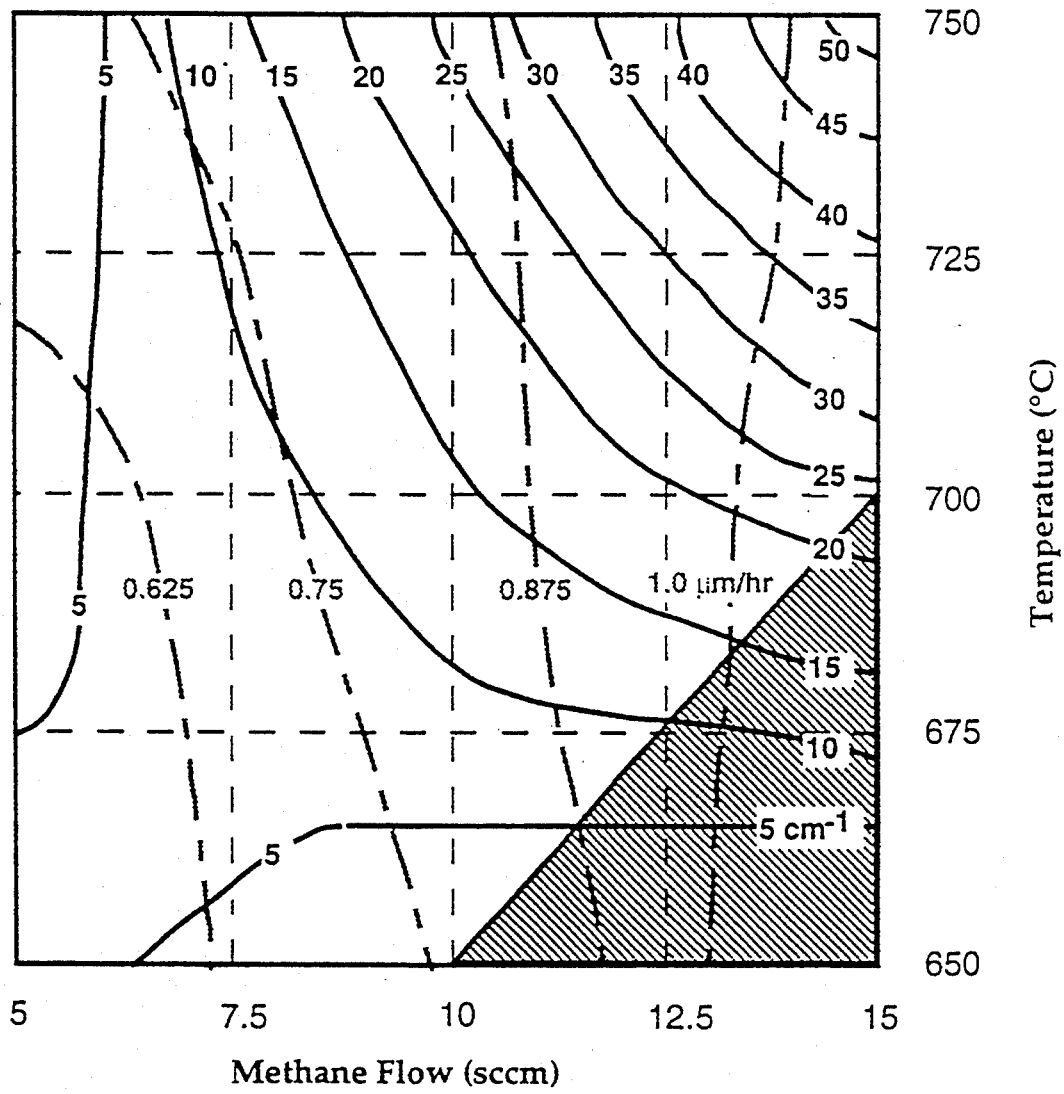
FIG. 11c is a graph displaying an overlay of FIGS. 11a and 11b with the shaded region indicating where the (100)-textured growth should occur, as described in Example 1.

FIG. 10 displays a schematic representation of the data obtained from the texturing SED performed during stage 2. The growth rate, Raman 1332 $cm^{-1}$ line full width at half maximum (fwhm), and qualitative morphology are superimposed onto the 2-dimensional temperature vs. gas composition parameter space. FIGS. 11a and 11b show the calculated contour plots of the predicted values for both the growth rate and Raman fwhm respectively. FIG. 11c shows an overlay of the two plots with the shaded region indicating areas of acceptable (100) morphology.

It is important to note that the contour plots calculated from the statistical experimental design are used to predict relative trends in the data and not absolute values. They are thus used to determine the best operating regions of the parameter space. Based on these results, the low temperature and high $CH_4$-to-CO region of the parameter space appeared promising for obtaining high quality (100)-textured diamond at high growth rates. To improve upon the uniformity across the two inch wafer, the pressure was reduced from 50 torr, used for the SED, to 35 torr as indicated in Table 2 and all other parameters were maintained constant.

Figure 12A:
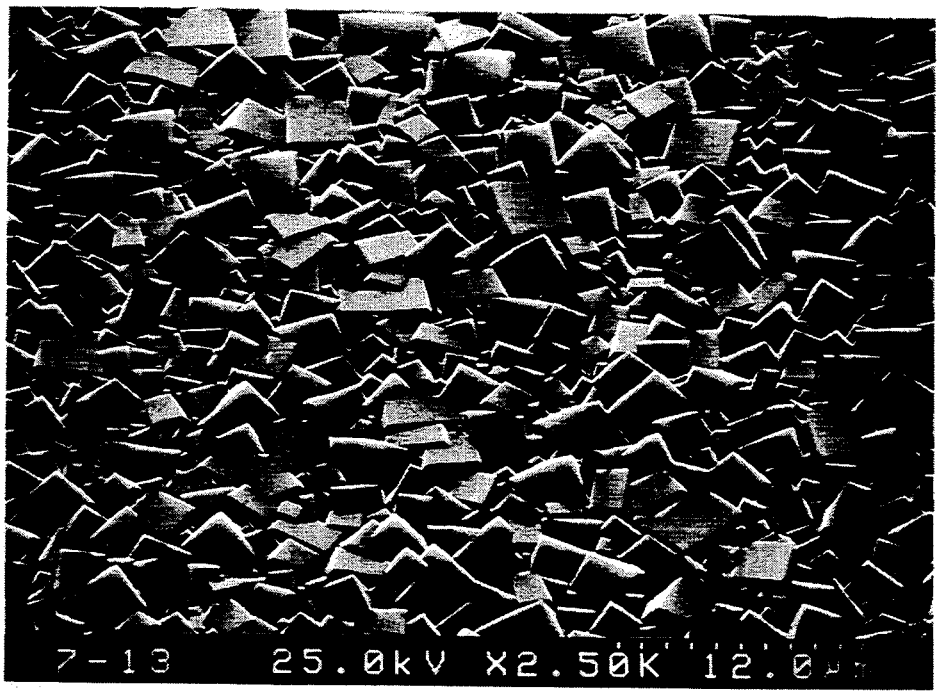
FIGS. 12a and 12b are planar and cross-sectional microphotographs, respectively, illustrating a textured diamond film grown under conditions as described in Example 1.
Figure 12B:
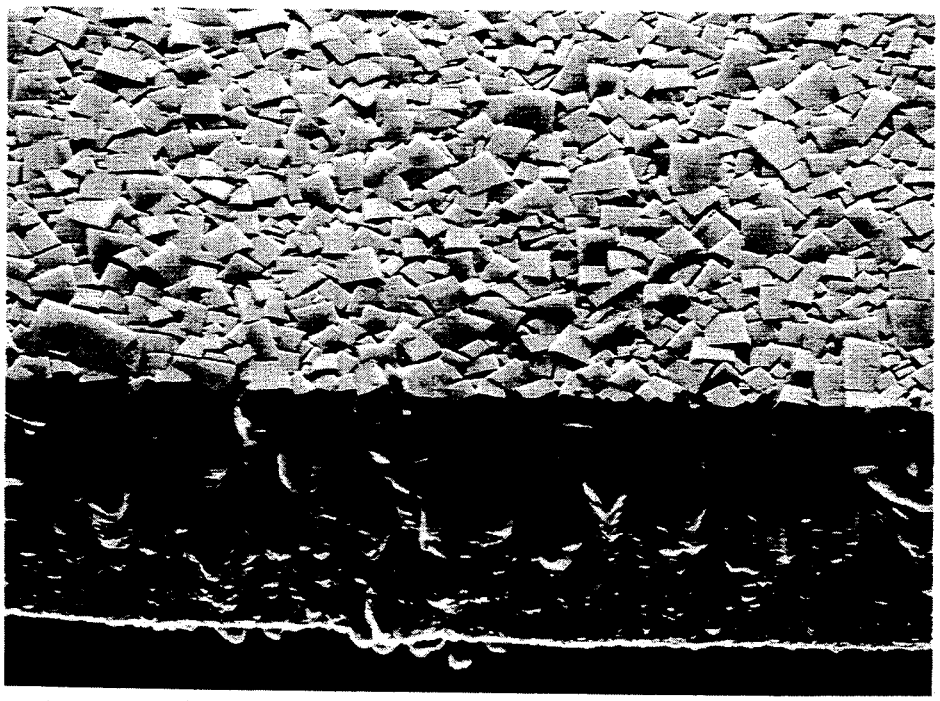

FIGS. 12a and 12b show planar and cross sectional views respectively of the resulting film after 40 hours of growth under the conditions listed in Table 2 with the pressure reduced to 35 torr. These figures indicate that it is possible to grow out the diamond film to produce both a high quality and highly textured surface.

Figure 13A:
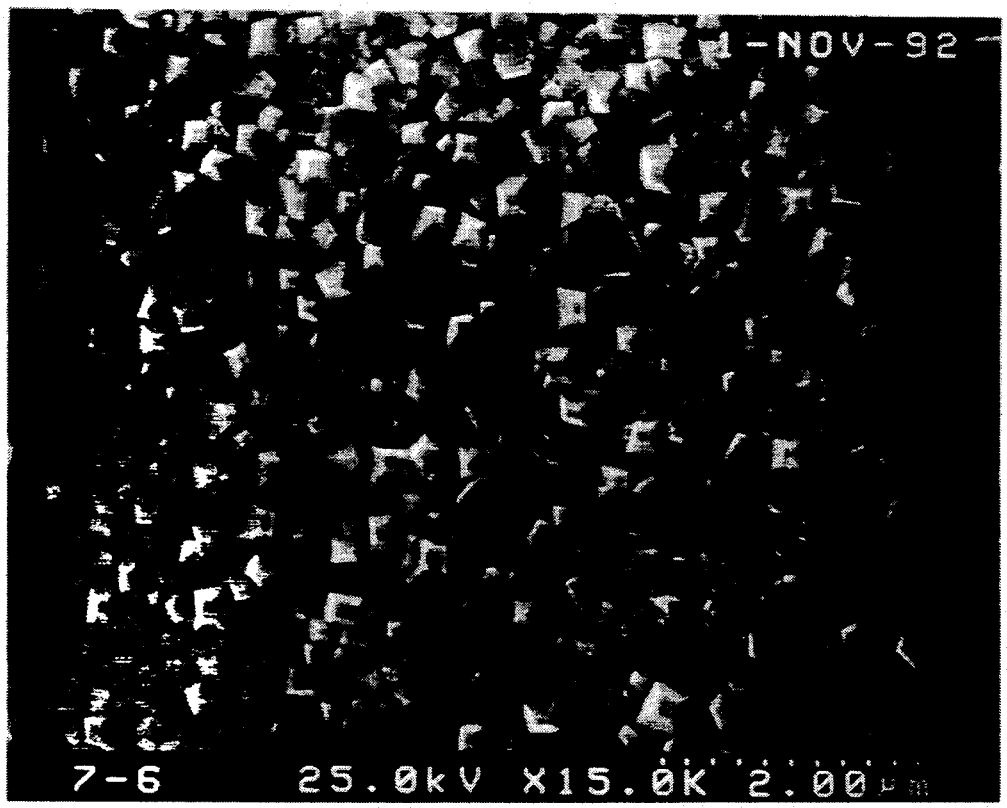
FIGS. 13a, 13b and 13c are planar microphotographs after carburization and bias enhanced nucleation, after 10 hours of textured growth, and after 30 hours of textured growth, respectively, as described in Example 1.
Figure 13B:
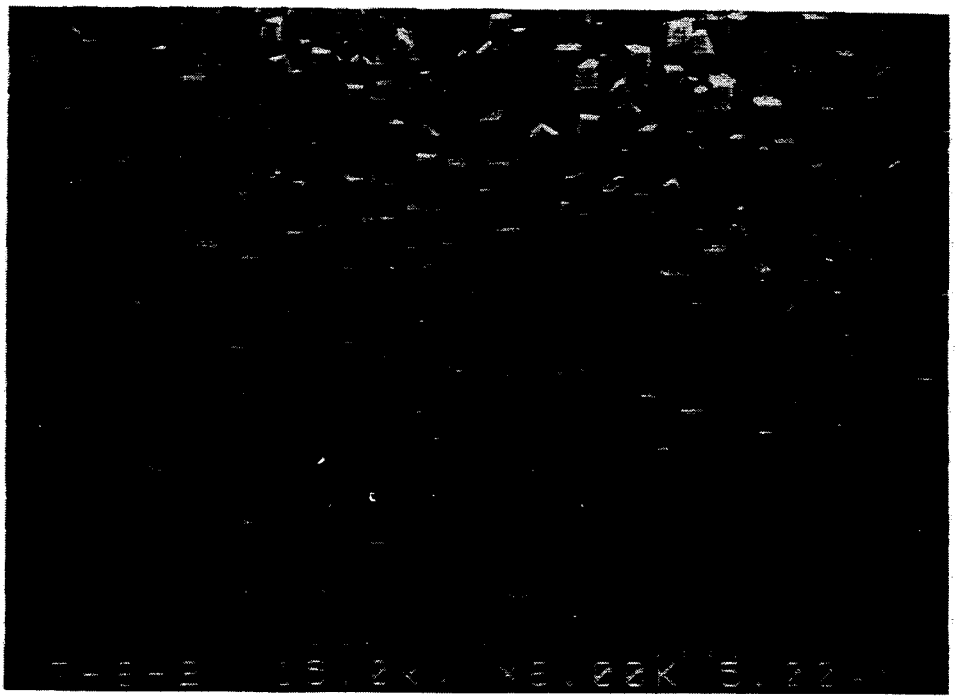
Figure 13C:
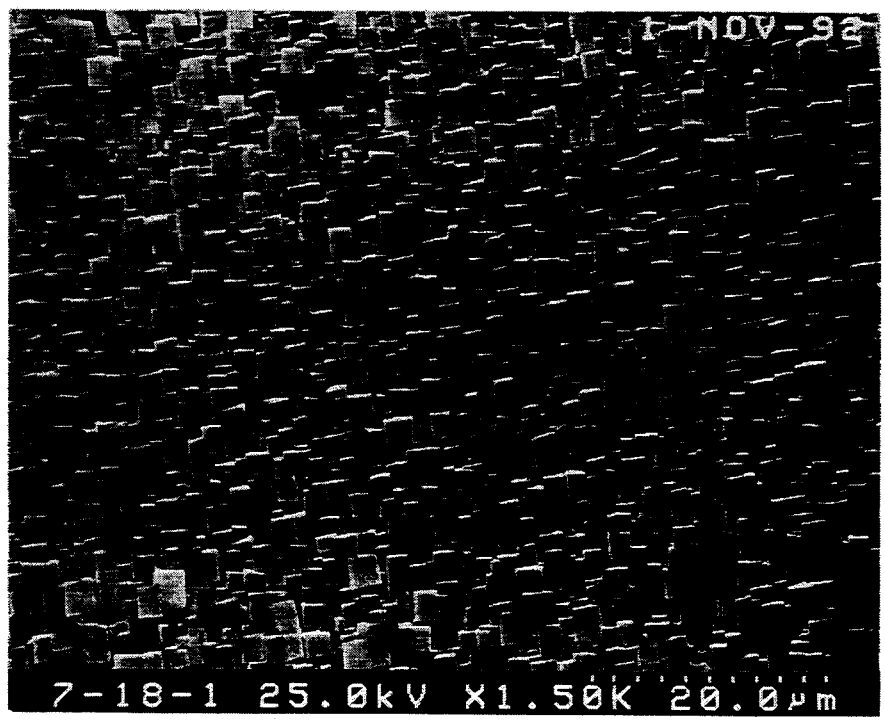

By combining the epitaxial nucleation and texturing steps it was then possible to grow films such that nearly 100% of the resulting grains were both (100)-textured and in an epitaxial alignment relative to the silicon substrate. FIGS. 13a–13c show the transition from a partially oriented film produced in step 1 to a film where almost all of the grains are oriented relative to the substrate.

Figure 14:
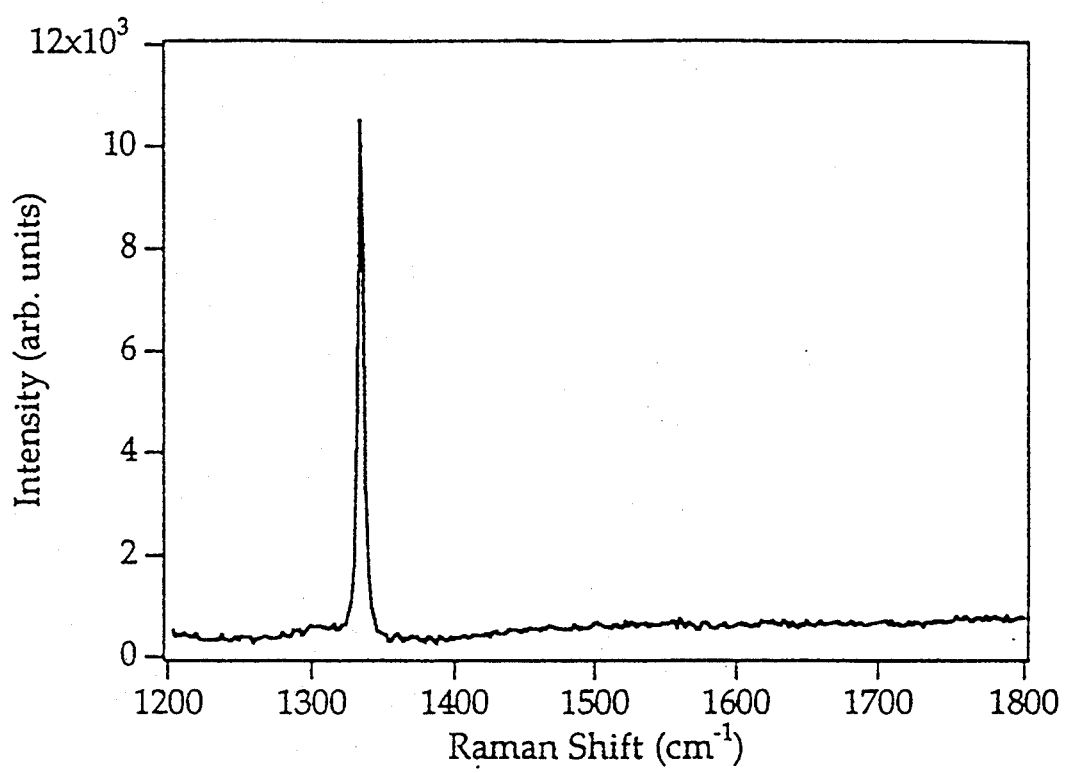
FIG. 14 is a Raman spectra of the diamond film shown in FIGS. 3 and 4, and as described in Example 1.

FIGS. 3 and 4 display planar and cross sectional views of a highly oriented diamond film after an additional 10 hours of growth displaying the low surface roughness and the columnar grain growth. These figures show how individual grains have coalesced into larger ones. The Raman spectra for this film is shown in FIG. 14 and indicates that the diamond is high quality (fwhm $\sim 4$ cm$^{-1}$) with little non-diamond component present.

Upon closer examination of FIGS. 3 and 4, one notices that low angle grain boundaries have developed between (100)-oriented grains. This misorientation is believed to be due to the large concentration of misfit dislocations at the diamond/SiC interface. The high density of misfit dislocations occur due to the large lattice mismatch between diamond and $\beta$-SiC ($\sim 20\%$). Both a tilt and azimuthal type misorientation of 0 to 6 degrees may result from the inclined 60-degree type misfit dislocations, which occur in diamond and zincblend structures. The effect of these low angle boundaries on the resulting electrical characteristics is yet to be seen, although one would expect to observe a decrease in carrier transport properties as a function of increasing misorientation angle. It should therefore be beneficial to continue to grow the films out to even greater thicknesses to reduce the overall misorientation.

The degree of texture improves with film thickness due to the fact that under conditions where (100) faces are growing much faster than (111) faces, all grains not textured with (100) parallel to the surface will eventually grow out of existence. Therefore, any tilt-type misorientation should eventually be covered by the parallel (100) grains. The grains that are misoriented azimuthally, and are still parallel to the substrate though will survive according to the Van Der Drift evolutionary growth theory. However, if the azimuthal misorientation is due to misfit dislocations, then it is likely that a tilt would result as well, ensuring that the misoriented grain would eventually become covered as film thickness increased.

Polycrystalline diamond has received limited acceptance as a viable electronic device material due to the presence of grain boundaries and their deleterious effect on electrical properties. Mobility values for polycrystalline films range from 10 to 30 cm$^2$/V-s, and are an order of magnitude below the 300 to 400 cm$^2$/V-s reported for homoepitaxially grown films. See, for example, J. A. von Windheim et al., submitted to Diamond and Rel. Mat. and presented at *Diamond Films '92 in Heidelberg Germany*, Aug. 31–Sept. 4, 1992 and J. A. von Windheim et al., submitted to *The Journal of Electronic Materials* (1992). Moreover, it has been speculated that grain boundaries, through charge trapping and carrier depletion, dominate the electrical properties and compromise the expected benefits of diamond in electronic applications.

It is believed that the carburization-biasing-growth sequence presented herein represents an approach to achieving a near-single crystal morphology which may allow diamond to realize its potential as an electronic material through yielding significantly improved transport characteristics.

EXAMPLE 2

Typical mobility values for boron doped polycrystalline films range from 1 to 30 cm$^2$/V-s, and are one to two orders of magnitude below mobilities reported for homoepitaxial films grown on single crystals. The purpose of this Example was to develop Hall effect data demonstrating the relative improvement in electronic properties resulting from the oriented growth for diamond films grown on silicon. Accordingly, two undoped diamond films were grown to be used as substrates for deposition of a boron doped layer. One film was polycrystalline and the other highly oriented, (100) textured.

The polycrystalline sample was grown on a 5×5 mm$^2$ Si die in a tubular, NIRIM style microwave plasma chemical vapor deposition (CVD) reactor. The surface of the Si substrate was abraded with 0.25 $\mu$m diamond grit as a nucleation pretreatment prior to deposition. The film shows a fair amount of secondary nucleation, with a Raman full width at half maximum of approximately 8 cm$^{-1}$ and was approximately 20 $\mu$m thick. The oriented films were grown on 1 cm$^2$ Si dies in a stainless steel microwave plasma CVD reactor under pretreatment and growth conditions which have been discussed herein and are listed in Table 3 below.

TABLE 3

| PARAMETERS | 3-step process for oriented (100) textured diamond | | |
|---|---|---|---|
| | PRETREAT-MENT | BIAS NUCLEATION | GROWTH |
| Bias Voltage (VDC) | — | 170–200 V | — |
| Bias Current (mA) | — | 300–400 mA | — |
| $\mu$-wave Power (watts) | 1000 W | 1000 W | 1300 W |
| Pressure (torr) | 20 T | 20 T | 35 T |
| Gas Flow Rates (sccm) | | | |

TABLE 3-continued

| PARAMETERS | 3-step process for oriented (100) textured diamond | | |
|---|---|---|---|
| | PRETREATMENT | BIAS NUCLEATION | GROWTH |
| $H_2$ | 300 sccm | 300 sccm | 180 sccm |
| $CH_4$ | 6 sccm | 6 sccm | 15 sccm |
| CO | — | — | 5 sccm |
| Heater Temp. (°C.) | 800° C. | 800° C. | 650° C. |
| Time | 3 hrs. | 15 min. | 10–40 hrs. |

The deposition process consisted of three steps: (i) an in-situ carburization that is speculated to convert the surface of the silicon substrate into an epitaxial carbide layer, (ii) a bias pretreatment that is intended to enhance diamond nucleation without significantly damaging the surface crystallinity, and (iii) a textured growth step which utilizes the Van Der Drift process to grow out the (100) faces that are parallel to the substrate.

A 1.5 µm thick boron doped layer was then grown on the surface of each undoped film using $B_2H_6$ and $CH_4$ in $H_2$ at a B/C ratio of 44 ppm in the gas phase. The doped layers were selectively deposited using sputtered $SiO_2$ to mask the edges of the substrate so that the p-type layer would be isolated in the center of the samples to avoid current leakage to the Si. The $SiO_3$ was removed in HF following growth, and the films were subsequently annealed at 600° C. for 30 minutes under vacuum at $10^{-7}$ Torr in order to dissociate hydrogen from the film surface. After annealing, the samples were boiled in a solution of $CrO_3+H_2SO_4$ at 200° C. to remove any graphite which may have formed during growth or annealing. Finally, the films were cleaned in Aqua Regia and RCA solutions to prepare a clean surface prior to making electrical contacts. A Van Der Pauw configuration was arranged using Indium contacts of ~500 µm in diameter. Hall effect measurements were performed at room temperature for both films and over a temperature range of 180°–400° K. for the oriented film.

Figure 15A:
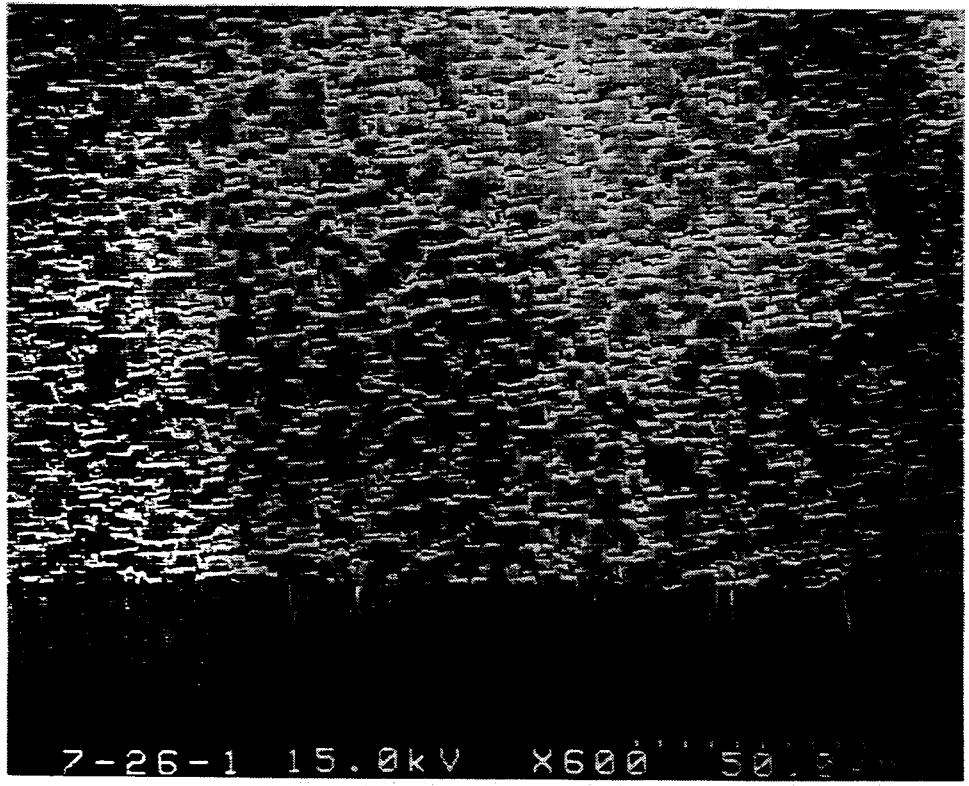
FIGS. 15a and 15b are cross-sectional microphotographs of an undoped highly oriented diamond film, and an oriented film following deposition thereon of a semiconducting diamond layer, as described in Example 2.
Figure 15B:
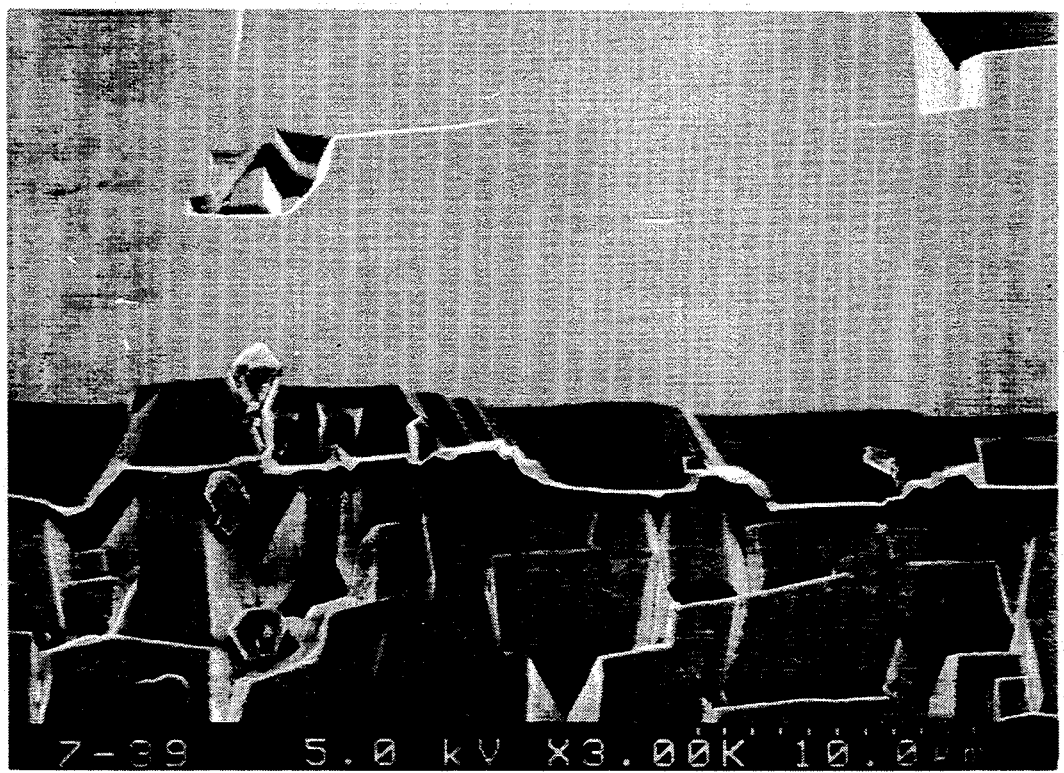

FIGS. 15a and 15b show scanning electron micrographs (SEM) of the oriented diamond film before and after the deposition of the boron doped layer, respectively. The figures show that the majority of the diamond grains are both (100)-textured and azimuthally oriented relative to the silicon substrate. Many of the grains have coalesced into larger (100) faces with some low angle grain boundaries of less than 5 degrees (as determined from cross sectional SEM observations).

FIG. 15b indicates that the doped layer appears to have grown homoepitaxially in a selectively patterned area where on edge is shown and maintained the (100) orientation. The boron doped layer has coalesced compared to the underlying undoped diamond layer.

Figure 16:
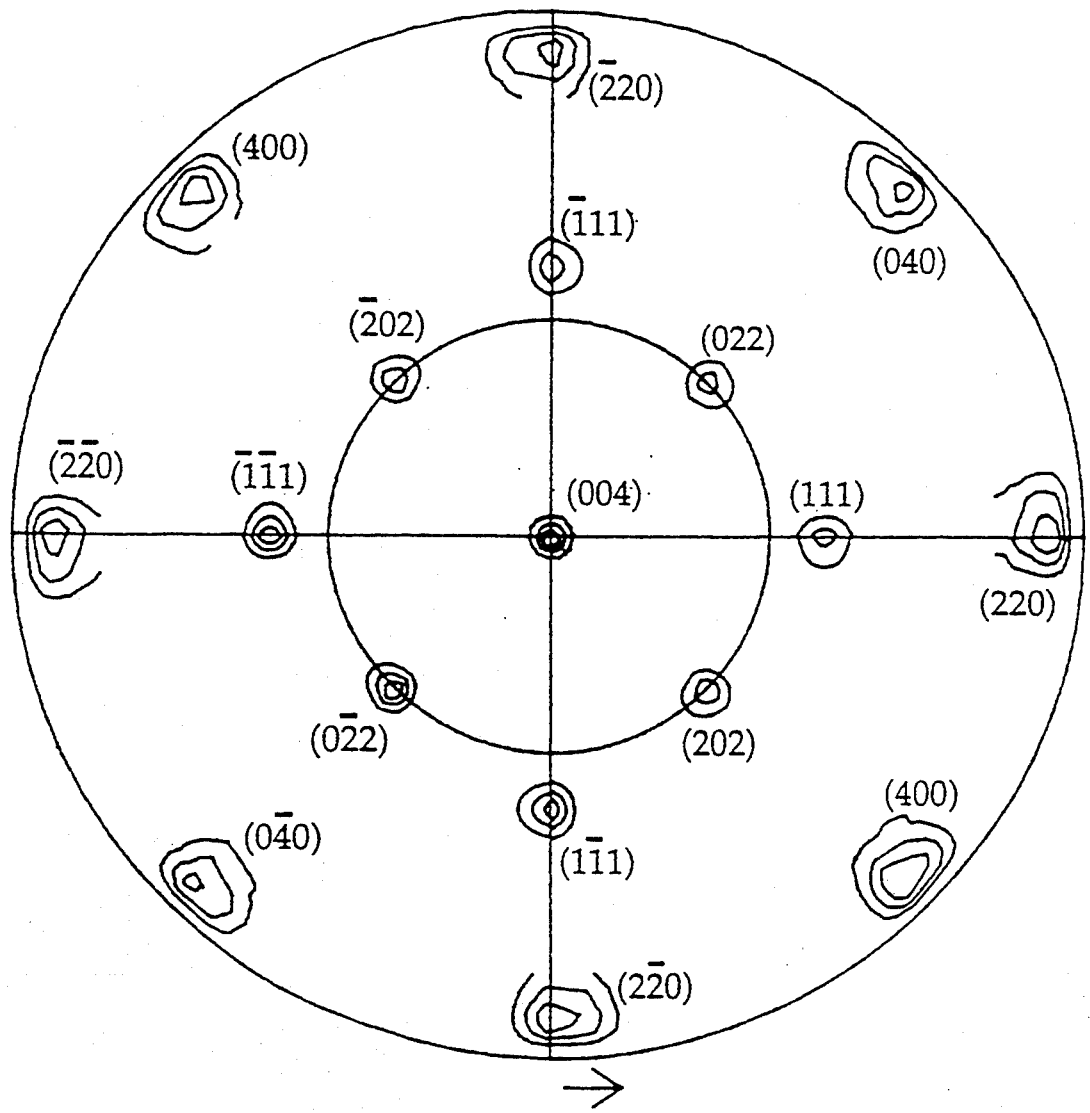
FIG. 16 is an XRD polar plot from the highly oriented film of FIG. 15b and as described in Example 2.

X-ray diffraction (XRD) polar measurements were performed on the oriented sample prior to deposition of the boron doped layer. The XRD analysis was conducted on a Phillips MRD 1880/HR with a 3 kW Cu radiation source. Texture mapping was facilitated via Philips "TEX" software. Incident radiation passed through a pinhole aperture while the diffracted radiation passed through a set of collimating slits and was reflected off a graphite plate prior to entering the detector. FIG. 16 displays the pole figure of a (004) projection and confirms that the film is both highly textured and azimuthally oriented. The full width at half maximum (fwhm) of the XRD peaks also gives an indication of the relative misorientation in the film, and was measured to be approximately 8 degrees for the (220) peaks at a Psi ($\psi$) angle of 45 degrees. This measurement should provide a baseline comparison between the amount of misorientation and the electrical properties.

Figure 17:
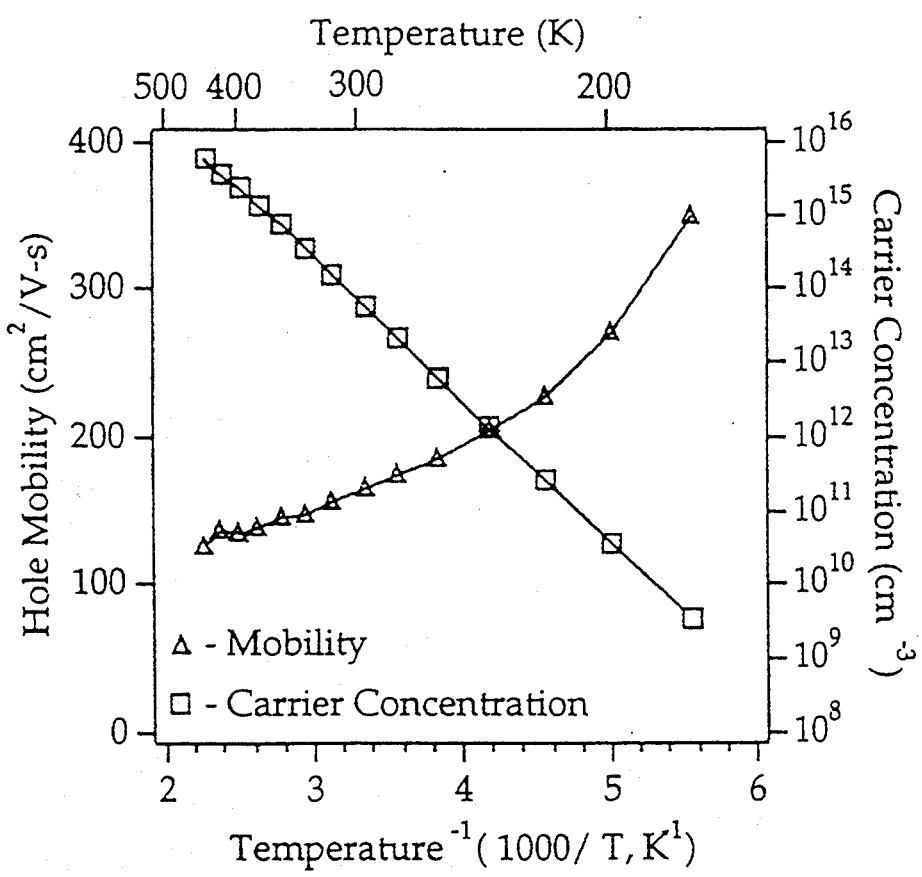
FIG. 17 is graph illustrating carrier concentration and hole mobility as a function of temperature for the highly oriented boron doped diamond film of FIG. 15b as described in Example 2.

FIG. 17 displays the carrier concentration and hole mobility of the oriented film as a function of temperature from 180 to 440 K, as determined by Hall effect measurements. A mobility of $165\pm9$ $cm^2/V$-s was measured at room temperature. Applicants believe this to be the highest room temperature mobility measured to date for a non-single crystal film (approximately 5 times higher than the highest reported values for polycrystalline films). The active carrier concentration at room temperature was $5.9\pm0.3\times10^{13}$ $cm^{-3}$, and the acceptor ionization energy was calculated from the slope of the $K\{\ln(p)-3/2\ln(T)\}$ vs $1/T$ plot to be $0.346\pm0.002$ eV. An additional source of error can be expected due to the fact that the contacts did not illustrate perfect ohmic current-voltage characteristics. Although this error has not been quantified, it is expected to be reasonably small due to the large signal to noise ratios observed in the Hall voltage measurements.

Room temperature Hall effect and resistivity measurements were also performed on the polycrystalline boron doped film which was grown simultaneously with the oriented film. Although the sample showed to be nonhomogeneous, an average mobility of ~2 $cm^2/V$-s was calculated, indicating a tremendous difference in the properties of the two films due to substrate. The resistivity of the polycrystalline film at room temperature was $1.91\pm0.02\times10^5$ $\Omega$-cm as compared to $644\pm8$ $\Omega$-cm for the oriented film.

In summary based on the Hall effect measurements performed in this Example, it was shown that the crystallographic morphology of the diamond films play an important role in the electronic transport properties. Significant improvements in transport properties were accomplished using a three step deposition process; carburization, bias-enhanced nucleation (BEN), and textured growth process to form highly oriented diamond films. The BEN process was responsible for the initial epitaxial nucleation of diamond grains; however, the textured growth stage was essential for the growth of the resulting highly textured diamond surface. A boron doped layer grown on a highly oriented diamond film exhibited a room temperature hole mobility of 165 $cm^2/V$-s, approximately 5 times greater than the highest reported mobilities for polycrystalline diamond films and within the same order of magnitude of homoepitaxial layers grown on single crystal diamond substrates. The fact that the mobility is still less than that of similar boron doped films grown on single crystal suggests that the low angle grain boundaries ($\leq 5$ degrees) do have some effects on transport properties.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A microelectronic structure comprising:
   a single crystal nondiamond substrate;
   a plurality of laterally spaced apart diamond structures on said single crystal nondiamond substrate, each of said diamond structures having an outermost face being substantially oriented relative to said single crystal nondiamond substrate wherein a crystal lattice plane generally defined at the outermost face is substantially parallel to a crystal lattice plane defined by a corresponding adjacent portion of said single crystal nondiamond substrate, each of said diamond structure comprising highly oriented textured diamond including a plurality of side-by-side columnar signal crystal diamond grains extending outwardly form said single crystal nondiamond substrate; and a respective semiconductor device on each of said plurality of diamond structures.

2. A microelectronic structure according to claim 1 wherein each of said semiconductor devices comprises a respective semiconducting diamond layer on the outermost face of each of said plurality of diamond structures.

3. A microelectronic structure according to claim 1 wherein said single crystal nondiamond substrate has a (100)-oriented face adjacent said plurality of diamond structures, and wherein the outermost face of each of said plurality of diamond structures is (100)-oriented.

4. A microelectronic structure according to claim 1 wherein substantially all of said plurality of columnar single crystal diamond grains in each of said plurality of diamond structures are oriented with a tilt and azimuthal misorientation of less than about 8° relative to said single crystal nondiamond substrate.

5. A microelectronic structure according to claim 1 wherein each of said highly oriented textured diamond layers has a diamond nucleation site concentration adjacent said nondiamond substrate of greater than about $10^4/cm^2$.

6. A microelectronic structure according to claim 1 wherein each of said columnar single crystal diamond grains in respective diamond structures have outermost faces substantially flush with adjacent ones of said columnar single crystal diamond grains so that the outermost face at each of said diamond structures is relatively flat.

7. A microelectronic structure according to claim 1 further comprising a respective semiconducting diamond layer on the outermost faces of said plurality of columnar single crystal diamond grains in each of said plurality of diamond structures, and wherein each of said semiconductor diamond layers has a hole mobility at room temperature corresponding to a value greater than about 100 $cm^2/V$-s for a dopant concentration of about $10^{18}$ $cm^{-3}$.

8. A microelectronic structure according to claim 1 further comprising a respective semiconducting diamond layer on the outermost faces of said plurality of columnar single crystal diamond grains in each of said plurality of diamond structures, and wherein each of said semiconductor diamond layers has a hole mobility at room temperature corresponding to a value greater than about 300 $cm^2/V$-s for a dopant concentration of about $10^{18}$ $cm^{-3}$.

9. A microelectronic structure according to claim 1 wherein each of said plurality of diamond structures has an innermost face adjacent said nondiamond substrate, and wherein the innermost face of each of said plurality of diamond structures is planar and devoid of protrusions.

10. A microelectronic structure according to claim 1 further comprising a carbide interfacial layer between each of said plurality of diamond structures and said nondiamond substrate.

11. A microelectronic structure according to claim 1 wherein each of said plurality of diamond structures are arranged in an array having predetermined lateral spacings between adjacent diamond structures.

12. A microelectronic structure according to claim 1 wherein each of said semiconductor devices comprises a field effect transistor.

13. A microelectronic structure according to claim 1 wherein each of said plurality of diamond structures has outermost face dimensions not less than about 20 microns on a side.

14. A microelectronic structure according to claim 1 wherein said single crystal nondiamond substrate comprises silicon.

15. A microelectronic structure according to claim 1 wherein said single crystal nondiamond substrate comprises a material selected from the group consisting of refractory metals and their carbides, cubic-boron nitride, $\alpha$-silicon carbide, $\beta$-silicon carbide, copper, and nickel.

16. A microelectronic structure according to claim 1 wherein said single crystal nondiamond substrate comprises copper, nickel or alloys thereof; and further comprising an interfacial layer between said substrate and said plurality of diamond structures, and wherein said interfacial layer comprises titanium carbide.

17. A microelectronic device according to claim 1 further comprising a filler material between adjacent ones of said plurality of diamond structures.

18. A microelectronic structure comprising:
a single crystal nondiamond substrate; and
a highly oriented textured diamond layer on said single crystal nondiamond substrate, said highly oriented textured diamond layer including a plurality of side-by-side columnar single crystal diamond grains extending outwardly from said single crystal nondiamond substrate, said highly oriented textured diamond layer having a nucleation site concentration adjacent said nondiamond substrate of greater than about $10^4/cm^2$, said plurality of single crystal diamond grains having respective outermost faces being substantially oriented relative to said single crystal nondiamond substrate wherein respective crystal lattice planes defined at the outermost faces are substantially parallel to respective crystal lattice planes defined by corresponding adjacent portions of said single crystal nondiamond substrate.

19. A microelectronic structure according to claim 18 wherein substantially all of said plurality of columnar single crystal diamond grains are oriented with a tilt and azimuthal misorientation of less than about 8° relative to said single crystal nondiamond substrate.

20. A microelectronic structure according to claim 18 wherein the outermost faces of said plurality of columnar single crystal diamond grains are substantially flush with adjacent faces to form an overall relatively flat outermost face of said highly oriented textured diamond layer.

21. A microelectronic structure according to claim 18 further comprising a semiconducting diamond layer on the outermost face of said highly oriented textured diamond layer, and wherein said semiconductor diamond layer has a hole mobility at room temperature corresponding to a value greater than about 100 $cm^2/V$-s for a dopant concentration of about $10^{18}$ $cm^{-3}$.

22. A microelectronic structure according to claim 18 further comprising a semiconducting diamond layer on the outermost face of said highly oriented textured diamond layer, and wherein said semiconductor diamond layer has a hole mobility at room temperature corresponding to a value greater than about 300 cm$^2$/V-s for a dopant concentration of about $10^{18}$ cm$^{-3}$.

23. A microelectronic structure according to claim 18 wherein said highly oriented textured diamond layer has an innermost face adjacent said nondiamond substrate being planar and devoid of any protrusions.

24. A microelectronic structure according to claim 18 further comprising a semiconductor device on said highly oriented textured diamond layer, and wherein said semiconductor device comprises a semiconducting diamond layer on an outermost face of said highly oriented textured diamond layer.

25. A microelectronic structure according to claim 18 wherein said single crystal nondiamond substrate has a (100)-oriented face adjacent said highly oriented textured diamond layer, and wherein an outermost face of said highly oriented textured diamond layer is (100)-oriented.

26. A microelectronic structure according to claim 18 further comprising a carbide interfacial layer between said highly oriented textured diamond layer and said single crystal nondiamond substrate.

27. A microelectronic structure according to claim 18 wherein said highly oriented textured diamond layer has outermost face dimensions not less than about 20 microns on a side.

28. A microelectronic structure according to claim 18 wherein said nondiamond substrate comprises silicon.

29. A microelectronic structure according to claim 18 wherein said nondiamond substrate comprises a material selected from the group consisting of refractory metals and their carbides, cubic-boron nitride, α-silicon carbide, β-silicon carbide, copper, and nickel.

30. A microelectronic structure according to claim 18 wherein said single crystal nondiamond substrate comprises copper, nickel or alloys thereof; and further comprising an interfacial layer between said substrate and said highly oriented textured diamond layer, and wherein said interfacial layer comprises titanium carbide.

31. A microelectronic structure according to claim 30 further comprising a semiconductor device on said highly oriented textured diamond layer, and wherein said semiconductor device comprises a semiconducting diamond layer on the second major face of said highly oriented textured diamond layer.

32. A microelectronic structure according to claim 30 wherein the outer faces of said plurality of columnar single crystal diamond grains are (100) oriented.

33. A microelectronic structure comprising a highly oriented textured diamond layer having opposing first and second major faces, said highly oriented textured diamond layer comprising a plurality of side-by-side columnar single crystal diamond grains extending between the first and second opposing major faces of said diamond layer, said highly oriented textured diamond layer having a nucleation site concentration at the first major face of greater than about $10^4$/cm$^2$, said plurality of columnar single crystal diamond grains having respective outer faces at the second major face of said diamond layer being substantially oriented relative to one another wherein respective crystal lattice planes defined at the outermost faces are substantially parallel to one another 34. A microelectronic structure according to claim 33 wherein the first major face of said highly oriented textured diamond layer is planar and devoid of protrusions.

35. A microelectronic structure according to claim 33 wherein substantially all of said plurality of columnar single crystal diamond grains are oriented with a tilt and azimuthal misorientation of less than about 8° relative to one another.

36. A microelectronic structure according to claim 33 wherein the outer faces of said plurality of columnar single crystal diamond grains at the second major face of said highly oriented textured diamond layer are substantially flush with adjacent faces to form an overall relatively flat second major face for said highly oriented textured diamond layer.

37. A microelectronic structure according to claim 33 further comprising a semiconducting diamond layer on the second face of said highly oriented textured diamond layer, and wherein said semiconductor diamond layer has a hole mobility at room temperature corresponding to a value greater than about 100 cm$^2$/V-s for a dopant concentration of about $10^{18}$ cm$^{-3}$.

38. A microelectronic structure according to claim 33 further comprising a semiconducting diamond layer on the second face of said highly oriented textured diamond layer, and wherein said semiconductor diamond layer has a hole mobility at room temperature corresponding to a value greater than about 300 cm$^2$/V-s for a dopant concentration of about $10^{18}$ cm$^{-3}$.

39. A microelectronic structure according to claim 33 further comprising a single crystal nondiamond substrate adjacent said first major face of said highly oriented textured diamond layer.

40. A microelectronic structure according to claim 39 wherein said nondiamond substrate comprises silicon.

41. A microelectronic structure according to claim 39 wherein said nondiamond substrate comprises a material selected from the group consisting of refractory metals and their carbides, cubic-boron nitride, α-silicon carbide, β-silicon carbide, copper, and nickel.

42. A microelectronic structure according to claim 39 wherein said single crystal nondiamond substrate comprises copper, nickel or alloys thereof; and further comprising an interfacial layer between said substrate and said highly oriented textured diamond layer, and wherein said interfacial layer comprises titanium carbide.

43. A microelectronic structure comprising:
 a single crystal nondiamond substrate;
 a plurality of diamond layers on said single crystal nondiamond substrate, each of said diamond layers comprising a plurality of single crystal diamond grains having progressively increasing outer face dimensions in successive layers extending outwardly from said nondiamond substrate, an outermost diamond layer comprising a plurality of laterally spaced apart single crystal diamond grains having respective outermost faces being substantially oriented relative to corresponding adjacent portions of said single crystal nondiamond substrate; and
 a respective semiconductor device on each of said laterally spaced apart single crystal diamond grains of the outermost diamond layer.

44. A microelectronic structure according to claim 43 wherein each of said semiconductor devices comprises a respective semiconducting diamond layer on the outermost face of each of said plurality of laterally spaced apart single crystal diamond grains.

45. A microelectronic structure according to claim 43 further comprising a carbide interfacial layer between said plurality of diamond layers and said nondiamond substrate.

46. A microelectrOnic structure according to claim 43 wherein each of said plurality of laterally spaced apart single crystal diamond grains are arranged in an array having predetermined lateral spacings between adjacent single crystal diamond grains.

47. A microelectronic structure according to claim 43 wherein each of said semiconductor devices comprises a field effect transistor.

48. A microelectronic structure according to claim 43 wherein each of said plurality of laterally spaced apart single crystal diamond grains has outermost face dimensions not less than about 20 microns on a side.

49. A microelectronic structure according to claim 43 wherein said single crystal nondiamond substrate comprises silicon.

50. A microelectronic structure according to claim 43 wherein said single crystal nondiamond substrate comprises a material selected from the group consisting of refractory metals and their carbides, cubic-boron nitride, $\alpha$-silicon carbide, $\beta$-silicon carbide, copper, and nickel.

51. A microelectronic structure according to claim 43 wherein said single crystal nondiamond substrate comprises copper, nickel or alloys thereof; and further comprising an interfacial layer between Said substrate and said plurality of diamond structures, and wherein said interfacial layer comprises titanium carbide.

52. A microelectronic device according to claim 43 further comprising a filler material between adjacent ones of said plurality of laterally spaced apart single crystal diamond grains.

* * * * *